United States Patent
Jiang et al.

(10) Patent No.: US 10,627,959 B2
(45) Date of Patent: Apr. 21, 2020

(54) DIFFERENTIAL CIRCUIT, CAPACITANCE DETECTION CIRCUIT, TOUCH DETECTION DEVICE AND TERMINAL DEVICE

(71) Applicant: SHENZHEN GOODIX TECHNOLOGY CO., LTD., Shenzhen (CN)

(72) Inventors: Hong Jiang, Shenzhen (CN); Guangkai Yuan, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/258,580

(22) Filed: Jan. 26, 2019

(65) Prior Publication Data
US 2019/0196654 A1  Jun. 27, 2019

Related U.S. Application Data

(63) Continuation of application No. PCT/CN2017/111899, filed on Nov. 20, 2017.

(51) Int. Cl.
*G06F 3/041* (2006.01)
*G06F 3/044* (2006.01)
*G01R 27/26* (2006.01)

(52) U.S. Cl.
CPC ........ *G06F 3/0418* (2013.01); *G01R 27/26* (2013.01); *G01R 27/2605* (2013.01); *G06F 3/044* (2013.01); *G06F 3/0416* (2013.01)

(58) Field of Classification Search
CPC ...... G06F 3/0418; G06F 3/0416; G06F 3/044; G01R 27/26; G01R 27/2605
See application file for complete search history.

(56) References Cited

U.S. PATENT DOCUMENTS

| | | | |
|---|---|---|---|
| 8,791,754 B2 | 7/2014 | Lyden et al. | |
| 2013/0293294 A1 | 11/2013 | Lyden et al. | |
| 2015/0338958 A1* | 11/2015 | Decaro | G06F 3/044 345/174 |

(Continued)

FOREIGN PATENT DOCUMENTS

| CN | 202948026 U | 5/2013 |
|---|---|---|
| CN | 104049822 A | 9/2014 |

(Continued)

*Primary Examiner* — Abhishek Sarma

(57) ABSTRACT

The present application provides a differential circuit, which can improve a signal-to-noise ratio of an output signal. The differential circuit includes a front-end circuit and a processing circuit, where the front-end circuit includes a control circuit and a PGA circuit. The control circuit is configured to: control, at a first stage, the power supply to charge the two capacitors and control the two capacitors to discharge to the PGA circuit; and control, at a second stage, the PGA circuit to charge the two capacitors. The PGA circuit is configured to convert capacitance signals of the two capacitors into voltage signals at the first stage and the second stage respectively, and perform a difference operation. The processing circuit is configured to determine, according to the differential signals output by the front-end circuit at the first stage and the second stage, a target differential signal of voltages corresponding to the two capacitors.

20 Claims, 7 Drawing Sheets

(56) References Cited

U.S. PATENT DOCUMENTS

| | | | |
|---|---|---|---|
| 2016/0034094 A1* | 2/2016 | Kang | G06F 3/0416 345/173 |
| 2018/0088706 A1* | 3/2018 | Tanemura | G06F 3/044 |
| 2019/0102004 A1* | 4/2019 | Krah | G06F 1/1643 |
| 2019/0102037 A1* | 4/2019 | Krah | G06F 3/0416 |
| 2019/0294277 A1* | 9/2019 | Huang | H03F 3/70 |

FOREIGN PATENT DOCUMENTS

| | | |
|---|---|---|
| CN | 104090698 A | 10/2014 |
| CN | 104272590 A | 1/2015 |

\* cited by examiner

DIFFERENTIAL CIRCUIT, CAPACITANCE DETECTION CIRCUIT, TOUCH DETECTION DEVICE AND TERMINAL DEVICE

CROSS-REFERENCE TO RELATED APPLICATIONS

This application is a continuation of International Application No. PCT/CN2017/111899, filed on Nov. 20, 2017, the disclosure of which is hereby incorporated by reference in its entirety.

TECHNICAL FIELD

The present disclosure relates to the field of electronic technologies, and in particular, to a differential circuit, a capacitance detection circuit, a touch detection device, and a terminal device.

BACKGROUND

Capacitors are widely used in many terminal electronic devices, such as a touch sensor used for touch control on a display screen of a terminal device. During use of a capacitor, it is essentially required to measure and analyze capacitance of the capacitor. Currently, self-capacitance detection has become a very important measurement and analysis method.

However, self-capacitance tends to be relatively large, and the existing self-capacitance detection method has lower sensitivity when the self-capacitance is large. In addition, a cancel capacitor for improving the sensitivity is relatively large and cannot be integrated, and a cost of the cancel capacitor is also too high. Further, an increase in self-capacitance causes the sensitivity of the existing self-capacitance detection method to be lower, and a capacitance value cannot be correctly detected.

A differential circuit can be used to enhance the capacitance detection sensitivity to some extent. However, there still exists a noise signal such as 1/f noise and low frequency noise, affecting a signal-to-noise ratio of an output signal. Therefore, a low-noise differential circuit is urgently needed.

SUMMARY

Embodiments of the present disclosure provides a differential circuit, a capacitance detection circuit, a touch detection apparatus and a terminal device, which could effectively reduce a noise of the differential circuit and improve a signal-to-noise ratio of an output signal. When the differential circuit is applied in a capacitance detection circuit, accuracy of capacitance detection could be improved.

According to a first aspect, a differential circuit is provided. The differential circuit includes a front-end circuit and a processing circuit, where the front-end circuit is configured to convert capacitance signals of two capacitors connected to the front-end circuit into voltage signals and perform a difference operation on the voltage signals of the two capacitors connected to the front-end circuit.

The front-end circuit includes a control circuit and a programmable gain amplification (PGA) circuit, and the control circuit is connected with a power supply, the two capacitors and the (PGA) circuit.

The control circuit is configured to: control, at a first stage of a detection period, the power supply to charge the two capacitors connected to the front-end circuit and control the two capacitors connected to the front-end circuit to discharge to the (PGA) circuit; and control, at a second stage of the detection period, the (PGA) circuit to charge the two capacitors connected to the front-end circuit.

The (PGA) circuit is configured to convert the capacitance signals of the two capacitors connected to the front-end circuit into the voltage signals at the first stage and the second stage respectively, and perform a difference operation on the voltage signals of the two capacitors connected to the front-end circuit, to obtain a differential signal of voltages corresponding to the two capacitors connected to the front-end circuit at the first stage and a differential signal of voltages corresponding to the two capacitors connected to the front-end circuit at the second stage.

The front-end circuit outputs the differential signal of the two capacitors connected to the front-end circuit at the first stage and outputs the differential signal of the two capacitors connected to the front-end circuit at the second stage.

The processing circuit is connected to the front-end circuit and is configured to determine, according to the differential signal output by the front-end circuit at the first stage and the differential signal output by the front-end circuit at the second stage, a target differential signal of voltages corresponding to the two capacitors connected to the front-end circuit.

Therefore, in the differential circuit in an embodiment of the present disclosure, the front-end circuit outputs to the processing circuit a differential signal of voltages corresponding to the two capacitors connected to the front-end circuit, which is a differential process; the control circuit controls the two capacitors to discharge to the (PGA) circuit at the first stage, and control the (PGA) circuit to discharge to the two capacitors at the second stage related to the first stage, and the processing circuit determines a target differential signal according to differential signals output by the front-end circuit at the related first stage and the second stage respectively, which is a correlated double sample (Correlated Double Sample, CDS) process. By using the differential manner first, and then using the correlated double sample manner, a noise of the differential signal output by the differential circuit can be canceled to some extent.

Optionally, in a possible implementation manner, the control circuit includes a first switch set, a second switch set and a third switch set, the first switch set includes a first switch and a second switch, one end of the first switch is connected to the power supply and the other end of the first switch is connected to the second switch set, one end of the second switch is grounded and the other end of the second switch is connected to the second switch set, the second switch set is connected to the two capacitors connected to the front-end circuit, and the third switch set is connected to the (PGA) circuit and the two capacitors connected to the front-end circuit.

Optionally, in a possible implementation manner, the first stage includes a first time period and a second time period, and the second stage includes a third time period and a fourth time period.

The first switch and the second switch set are turned on during the first time period, the second switch and the third switch set are turned off during the first time period, and the power supply charges the two capacitors connected to the front-end circuit in the first time period.

The second switch set is turned off during the second time period, the third switch set is turned on during the second time period, and the two capacitors connected to the front-end circuit discharges to the (PGA) circuit in the second time period.

The first switch and the third switch set are turned off during the third time period, and the second switch and the second switch set are turned on during the third time period, and the voltage signals of the two capacitors connected to the front-end circuit discharge to ground in the third time period.

The second switch set is turned off during the fourth time period, the third switch set is turned on during the fourth time period, and the (PGA) circuit charges the two capacitors connected to the front-end circuit in the fourth time period.

Optionally, in a possible implementation manner, the second time period and the fourth time period are equal in length.

Optionally, in a possible implementation manner, the target differential signal of the two capacitors connected to the front-end circuit is a difference between the differential signal of the two capacitors connected to the front-end circuit at the second stage and the differential signal of the two capacitors connected to the front-end circuit at the first stage, or is half of the difference.

Optionally, in a possible implementation manner, the front-end circuit further includes a filter circuit and/or an integrator circuit, the filter circuit is configured to filter an interference signal from the target differential signal output by the front-end circuit, and the integrator circuit is configured to perform integral amplification processing on the target differential signal output by the front-end circuit.

According to a second aspect, a capacitance detection circuit is provided for detecting capacitance of N to-be-detected capacitors, wherein N is greater than or equal to 2, and the capacitance detection circuit includes at least N−1 first front-end circuits configured to convert capacitance signals of to-be-detected capacitors into first voltage signals and perform a difference operation on the first voltage signals, at least one second front-end circuit configured to convert the capacitance signals of the to-be-detected capacitors into second voltage signals and perform a difference operation on the second voltage signals, and a processing circuit.

Each of the at least N−1 first front-end circuits includes a first input end and a second input end, and each of the at least one second front-end circuit includes a third input end and a fourth input end.

A first input end and a second input end of each of at least N−2 first front-end circuits are connected to two different to-be-detected capacitors respectively.

A first input end of a first front-end circuit other than the at least N−2 first front-end circuits is connected to both a third input end of a second front-end circuit and a to-be-detected capacitor, a second input end of the first front-end circuit other than the at least N−2 first front-end circuits is connected to both a first input end of a first front-end circuit of the at least N−2 first front-end circuits and a to-be-detected capacitor, and the to-be-detected capacitors connected to the two input ends of the first front-end circuit other than the at least N−2 first front-end circuits are different to-be-detected capacitors.

Each of the first front-end circuits includes a first control circuit and a first programmable gain amplification (PGA) circuit, and the first control circuit is connected to a power supply, two to-be-detected capacitors connected to the first front-end circuit and the first (PGA) circuit.

The first control circuit is configured to: control, at a first stage of a detection period, the power supply to charge the two to-be-detected capacitors connected to the first front-end circuit and control the two to-be-detected capacitors connected to the first front-end circuit to discharge to the first (PGA) circuit; and control, at a second stage of the detection period, the first (PGA) circuit to charge the two to-be-detected capacitors connected to the first front-end circuit.

The first (PGA) circuit is configured to convert the capacitance signals of the two to-be-detected capacitors connected to the first front-end circuit into the first voltage signals at the first stage and the second stage respectively, and perform a difference operation on the first voltage signals of the two to-be-detected capacitors connected to the first front-end circuit, to obtain a first differential signal of voltages corresponding to the two to-be-detected capacitors connected to the first front-end circuit at the first stage and a first differential signal of voltages corresponding to the two to-be-detected capacitors connected to the first front-end circuit at the second stage.

A third input end of each of the at least one second front-end circuit is connected to a to-be-detected capacitor, and a fourth input end is connected to a reference capacitor.

Each second front-end circuit includes a second control circuit and a second (PGA) circuit, and the second control circuit is connected to a power supply, the second (PGA) circuit, the to-be-detected capacitor and the reference capacitor that are connected to the second front-end circuit.

The second control circuit is configured to: control, at the first stage, the power supply to charge to the to-be-detected capacitor and the reference capacitor that are connected to the second front-end circuit and the to-be-detected capacitor and control the reference capacitor that are connected to the second front-end circuit to discharge to the second (PGA) circuit; and control, at the second stage, the second (PGA) circuit to charge the to-be-detected capacitor and the reference capacitor that are connected to the second front-end circuit.

The second (PGA) circuit is configured to convert capacitance signals of the to-be-detected capacitor and the reference capacitor that are connected to the second front-end circuit into the second voltage signals at the first stage and the second stage respectively, and perform a difference operation on the second voltage signals of the to-be-detected capacitor and the reference capacitor that are connected to the second front-end circuit, to obtain a second differential signal of voltages corresponding to the to-be-detected capacitor and the reference capacitor that are connected to the second front-end circuit at the first stage and a second differential signal of voltages corresponding to the to-be-detected capacitor and the reference capacitor that are connected to the second front-end circuit at the second stage.

Each of the at least N−1 first front-end circuits outputs the first differential signal of the two to-be-detected capacitors connected to the front-end circuit at the first stage and outputs the first differential signal of the two to-be-detected capacitors connected to the front-end circuit at the second stage.

Each of the at least one second front-end circuit outputs the second differential signal of the to-be-detected capacitor and the reference capacitor that are connected to the second front-end circuit at the first stage and outputs the second differential signal of the to-be-detected capacitor and the reference capacitor that are connected to the second front-end circuit at the second stage.

The processing circuit is connected to an output end of each first front-end circuit and an output end of each second front-end circuit and is configured to: determine, according to the first differential signal output by the first front-end circuit at the first stage and the first differential signal output by the first front-end circuit at the second stage, a target differential signal of voltages corresponding to the two to-be-detected capacitors connected to the first front-end circuit; determine, according to the second differential signal output by the second front-end circuit at the first stage and the second differential signal output by the second front-end circuit at the second stage, a target differential signal of voltages corresponding to the to-be-detected capacitor and the reference capacitor that are connected to the second front-end circuit; and determine, according to the target differential signal of the two to-be-detected capacitors connected to the first front-end circuit and the target differential signal of the to-be-detected capacitor and the reference capacitor that are connected to the second front-end circuit, a capacitance value of each of the N to-be-detected capacitors.

Therefore, in the capacitance detection circuit, a first front-end circuit outputs, to a processing circuit, a first differential signal of voltages corresponding to two to-be-detected capacitors connected to the first front-end circuit, and a second front-end circuit outputs, to the processing circuit, the first differential signal of voltages corresponding to a to-be-detected capacitor and a reference capacitor that are connected to the second front-end circuit, which is a differential process; a first control circuit controls the two to-be-detected capacitors to discharge to a first (PGA) circuit at a first stage, and controls the first (PGA) circuit to charge the two to-be-detected capacitors at the second stage related to the first stage, and a second control circuit controls the to-be-detected capacitor and the reference capacitor to discharge to a second (PGA) circuit at the first stage, and controls the second (PGA) circuit to charge the to-be-detected capacitor and the reference capacitor at the second stage, which is a correlated double sample process. The processing circuit determines, according to the first differential signals output by the front-end circuit at the first stage and the second stage respectively, a target differential signal of the two to-be-detected capacitors connected to the first front-end circuit, the processing circuit determines, according to the second differential signals output by the front-end circuit at the first stage and the second stage respectively, a target differential signal of the to-be-detected capacitor and the reference capacitor that are connected to the second front-end circuit, and the processing circuit determines, according to the target differential signal of the two to-be-detected capacitors connected to the first front-end circuit and the target differential signal of the to-be-detected capacitor and the reference capacitor that are connected to the second front-end circuit, a capacitance value of each of the N to-be-detected capacitors. By using the differential manner first, and then using the double correlation sampling manner, a signal-to-noise ratio of the differential signal can be improved, thereby improving accuracy of capacitance detection.

Optionally, in a possible implementation manner, the first control circuit includes a first switch set, a second switch set and a third switch set, the first switch set includes a first switch and a second switch, one end of the first switch is connected to the power supply and the other end of the first switch is connected to the second switch set, one end of the second switch is grounded and the other end of the second switch is connected to the second switch set, the second switch set is connected to the two to-be-detected capacitors connected to the first front-end circuit, and the third switch set is connected to the first (PGA) circuit and the two to-be-detected capacitors connected to the first front-end circuit.

Optionally, in a possible implementation manner, the first stage includes a first time period and a second time period, and the second stage includes a third time period and a fourth time period.

The first switch and the second switch set are turned on during the first time period, the second switch and the third switch set are turned off during the first time period, and the power supply charges the two to-be-detected capacitors connected to the first front-end circuit in the first time period.

The second switch set is turned off during the second time period, the third switch set is turned on during the second time period, and the two to-be-detected capacitors connected to the first front-end circuit discharges to the first (PGA) circuit in the second time period.

The first switch and the third switch set are turned off during the third time period, the second switch and the second switch set are turned on during the third time period, and the first voltage signals of the two to-be-detected capacitors connected to the first front-end circuit discharge to ground in the third time period.

The second switch set is turned off during the fourth time period, the third switch set is turned on during the fourth time period, and the first (PGA) circuit charges the two to-be-detected capacitors connected to the first front-end circuit in the fourth time period.

Optionally, in a possible implementation manner, the second control circuit includes a fourth switch set, a fifth switch set and a sixth switch set, the fourth switch set includes a third switch and a fourth switch, one end of the third switch is connected to the power supply and the other end of the third switch is connected to the fifth switch set, one end of the fourth switch is grounded and the other end of the fourth switch is connected to the fifth switch set, the fifth switch set is connected to the to-be-detected capacitor and the reference capacitor that are connected to the second front-end circuit, and the sixth switch set is connected to the second (PGA) circuit and the to-be-detected capacitor and the reference capacitor that are connected to the second front-end circuit.

Optionally, in a possible implementation manner, the first stage includes a first time period and a second time period, and the second stage includes a third time period and a fourth time period.

The third switch and the fifth switch set are turned on during the first time period, and the fourth switch and the sixth switch set are turned off during the first time period, and the power supply charges the to-be-detected capacitor and the reference capacitor that are connected to the second front-end circuit in the first time period.

The fifth switch set is turned off during the second time period, the sixth switch set is turned on during the second time period, and the to-be-detected capacitor and the reference capacitor that are connected to the second front-end circuit discharges to the second (PGA) circuit in the second time period.

The third switch and the six switch set are turned off during the third time period, the fourth switch and the fifth switch set are turned on during the third time period, and the first voltage signals of the to-be-detected capacitor and the reference capacitor that are connected to the second front-end circuit discharge to ground in the fourth time period.

The fifth switch set is turned off during the fourth time period, the sixth switch set is turned on during the fourth time period, and the second (PGA) circuit charges the to-be-detected capacitor and the reference capacitor that are connected to the second front-end circuit in the fourth time period.

Optionally, in a possible implementation manner, the second time period and the fourth time period are equal in length.

Optionally, in a possible implementation manner, the target differential signal of the two to-be-detected capacitors connected to the first front-end circuit is a difference between the first differential signal of the two capacitors connected to the first front-end circuit at the second stage and the first differential signal of the two to-be-detected capacitors connected to the first front-end circuit at the first stage; and/or the target differential signal of the to-be-detected capacitor and the reference capacitor that are connected to the second front-end circuit is a difference between the second differential signal of the to-be-detected capacitor and the reference capacitor that are connected to the second front-end circuit at the second stage and the second differential signal of the to-be-detected capacitor and the reference capacitor that are connected to the second front-end circuit at the first stage.

According to a third aspect, an embodiment of the present disclosure provides a touch detection apparatus, where the touch detection apparatus includes the capacitance detection circuit according to the second aspect or any optional implementation manner of the second aspect. The touch detection apparatus determines a touch position of a user according to a capacitance value of each of the N to-be-detected capacitors determined by the capacitance detection circuit.

According to a fourth aspect, an embodiment of the present disclosure provides a terminal device, where the terminal device includes the touch detection apparatus according to the third aspect.

The terminal device in the embodiment of the present disclosure can more accurately determine a position that a user touches on the touch detection device, so that an influence of self-capacitance on the touch sensitivity is overcome and touch sensitivity of the terminal device is improved, and further an existing self-capacitance detection device can be optimized.

DESCRIPTION OF EMBODIMENTS

A description of technical solutions of the embodiments of the present disclosure will be given below in combination with the accompanying drawings.

Figure 1:
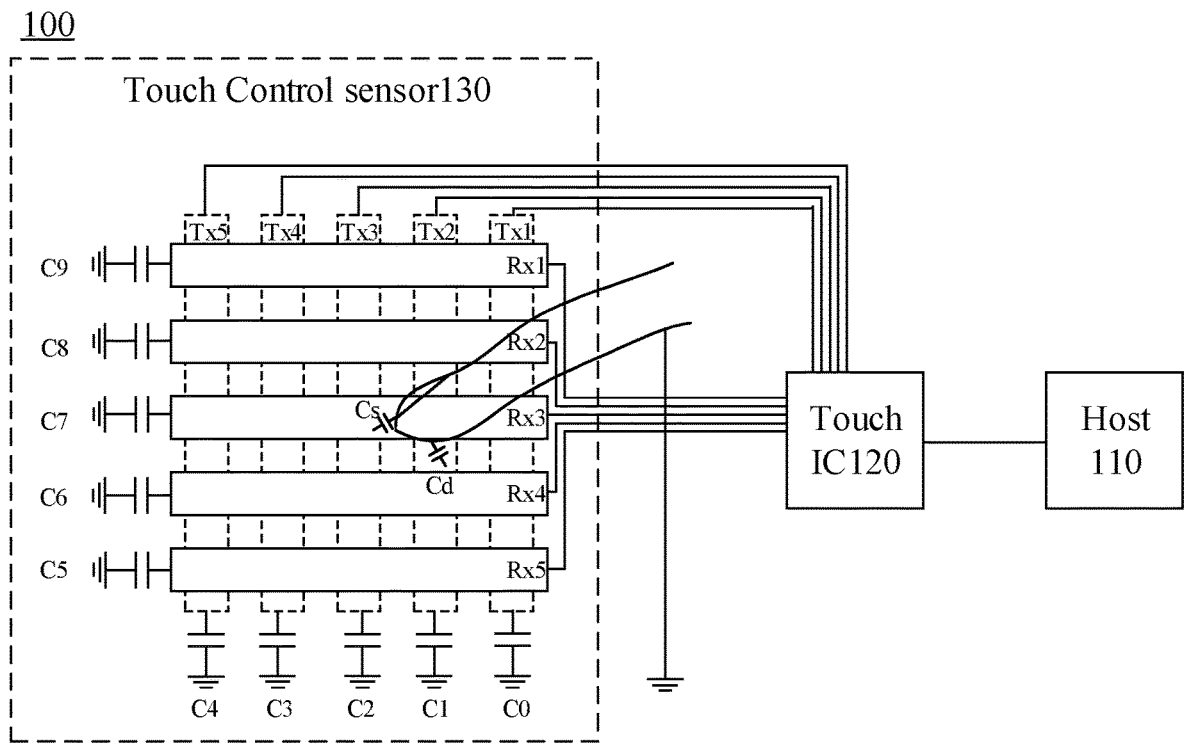
FIG. 1 is a schematic diagram of a possible application scenario of a differential circuit according to an embodiment of the present disclosure.

For ease of understanding, the following describes a possible application scenario of a differential circuit according to an embodiment of the present disclosure in combination with FIG. 1.

FIG. 1 shows a capacitive touch control system 100, the capacitive touch control system 100 includes a host (Host) 110, a touch integrated circuit (Touch IC) 120 and a touch control sensor 130. The touch control sensor 130 includes a layer Tx and a layer Rx, the layer Tx includes a channel Tx1, a channel Tx2, a channel Tx3, a channel Tx4 and a channel Tx5. The layer Rx includes a channel Rx1, a channel Rx2, a channel Rx3, a channel Rx4 and a channel Rx5. In the layer Tx, grounding capacitance of the channel Tx1, the channel Tx2, the channel Tx3, the channel Tx4 and the channel Tx5 are C0, C1, C2, C3 and C4, respectively; in the layer Rx, grounding capacitance of the channel Rx1, channel Rx2, channel Rx3, channel Rx4 and channel Rx5 are C9, C8, C7, C6, C5, respectively.

Each layer Tx in the touch control sensor 130 is connected to the Touch IC 120, and each layer Rx is connected to the Touch IC 120. Touch IC 120 is connected to the Host 110, and may communicate with the Host 110.

It should be understood that, self-capacitance detection is performed to detect a change in electrode-to-ground capacitance of each channel (layer Tx and layer Rx).

Specifically, the Touch IC 120 scans grounding capacitance change of each Tx channel and each Rx channel of the touch sensor 130. When a finger approaches, self-capacitance of a channel near the finger becomes larger, capacitance Cd is generated between the finger and a Tx channel, and capacitance Cs is generated between the finger and an Rx channel. Since a human body is electrically conductive and is connected to ground, self-capacitance of the channel Tx2 changes from C1 to C1+Cd, and self-capacitance of the channel Rx3 changes from C7 to C7+Cs. When the Touch IC 120 detects self-capacitance change of a channel, a touch position of the finger can be obtained through calculation.

Since capacitance value of the self-capacitance is relatively large, and an amount of change due to a finger touch is relatively small, a problem of lower touch sensitivity exists in the conventional self-capacitance detecting method. Increasing cancel capacitors can improve touch sensitivity; however, the cancel capacitors required are large in capacity and quantity, cannot be integrated into a chip, and also has a high cost. In some larger grounding capacitance scenarios, for example, for a touch display of the Galaxy Note7 of Samsung, a Y-OCTA technology is used in a subscriber data center (Subscriber Data Center, SDC). However, for a touch display based on the Y-OCTA technology, grounding capacitance of capacitance channels varies greatly, and it is difficult for the Touch IC 120 to detect channel self-capacitance change caused by finger touch, so that a touch position of the finger cannot be obtained through calculation.

An embodiment of the present disclosure further provides a differential circuit, and differential signals output in two relevant time periods for twice are collected and processed, thereby canceling noise signals of the differential circuit. In particular, the differential circuit can reduce noise signals such as a 1/f noise and a low-frequency noise present during differential.

It should be understood that, the differential circuit of the embodiment of the present disclosure can be applied to a scenario in which a differential operation is needed, for example, in a capacitance detection circuit, in particular a touch detection circuit.

Figure 2:
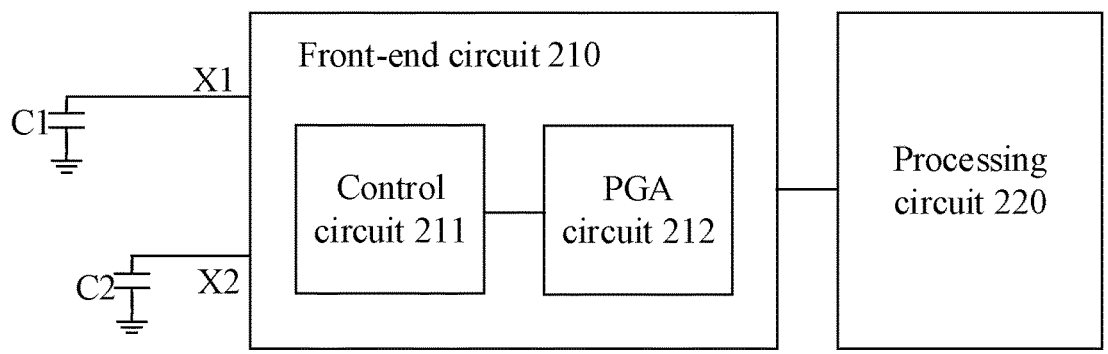
FIG. 2 is a schematic circuit diagram of a differential circuit according to an embodiment of the present disclosure.
Figure 3:
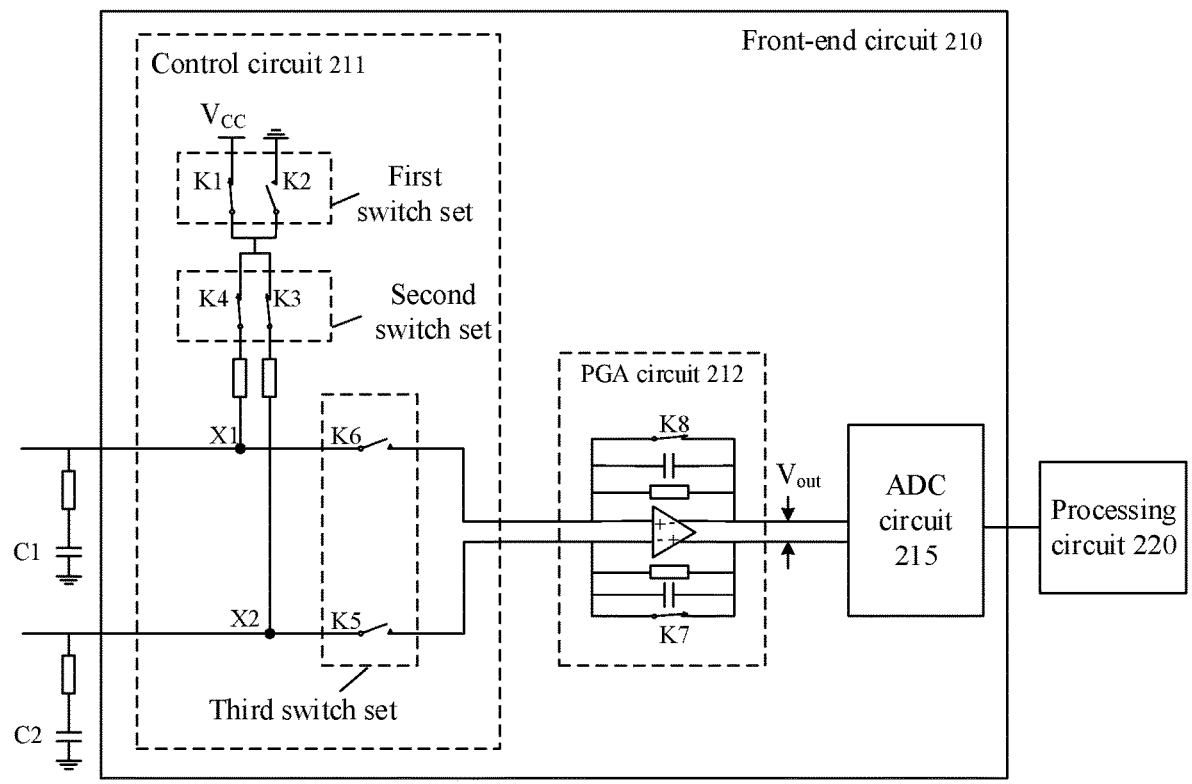
FIG. 3 is a schematic circuit diagram of another differential circuit according to an embodiment of the present disclosure.

The following will describe a differential circuit according to an embodiment of the present disclosure in detail with reference to FIG. 2 and FIG. 3.

FIG. 2 is a schematic structural diagram of a differential circuit 200 according to an embodiment of the present disclosure.

As shown in FIG. 2, the differential circuit 200 includes a front-end circuit 210 and a processing circuit 220. The front-end circuit 210 is configured to convert capacitance signals of two capacitors connected to the front-end circuit 210 into voltage signals and perform a difference operation on the voltage signals of the two capacitors connected to the front-end circuit 210.

The front-end circuit 210 includes a control circuit 211 and a programmable gain amplification (Programmable Gain Amplification, (PGA)) circuit 212, and the control circuit 211 is connected to a power supply, the two capacitors connected to the front-end circuit 210 and the (PGA) circuit 212.

Optionally, the control circuit 211 includes a first input end X1 and a second input end X2. The first input end X1 is connected to a capacitor C1 of the two capacitors connected to the front-end circuit 210 and the second input end X2 is connected to another capacitor C2.

The control circuit 211 is configured to control the power supply to charge the two capacitors connected to the front-end circuit 210 at a first stage of a detection period, control the two capacitors connected to the front-end circuit 210 to discharge to the (PGA) circuit 212 at a first stage of a detection period, and control the (PGA) circuit 212 to charge the two capacitors connected to the front-end circuit 210 at a second stage of the detection period.

The (PGA) circuit 212 is configured to convert, at the first stage and the second stage respectively, the capacitance signals of the two capacitors connected to the front-end circuit 210 into the voltage signals and perform a difference operation on the voltage signals of the two capacitors connected to the front-end circuit 210, to obtain a differential signal of voltages corresponding to the two capacitors connected to the front-end circuit 210 at the first stage, and a differential signal corresponding to the two capacitors connected to the front-end circuit at the second stage.

An output end of the front-end circuit 210 outputs the differential signal of the two capacitors connected to the front-end circuit 210 at the first stage and outputs the differential signal of the two capacitors connected to the front-end circuit 210 at the second stage.

The processing circuit 220 is connected to the output end of the front-end circuit 210, and is configured to determine, according to the differential signal output by the front-end circuit 210 at the first stage and the differential signal output by the front-end circuit 210 at the second stage, a target differential signal of the voltages corresponding to the two capacitors, namely C1 and C2, to which the front-end circuit 210 is connected.

Optionally, the processing circuit 220 may be a digital processing module (Digital Process Block).

It should be understood that, the processing circuit 220 has operation and storage functions.

Optionally, the processing circuit 220 may have a demodulation function, that is, an ability of signal demodulation.

It should be understood that, the differential signal received by the processing circuit 220 and output by the front-end circuit 210 is a single after an analog-to-digital conversion.

For example, an analog-to-digital conversion of a differential signal may be implemented by using an analog-to-digital conversion (Analog to Digital Conversion, ADC) circuit.

Therefore, in the differential circuit in an embodiment of the present disclosure, the front-end circuit outputs to the processing circuit a differential signal of voltages corresponding to the two capacitors connected to the front-end circuit, which is a differential process; the control circuit controls the two capacitors to discharge to the (PGA) circuit at the first stage, and controls the (PGA) circuit to discharge to the two capacitors at the second stage related to the first stage, and the processing circuit determines a target differential signal according to differential signals output by the front-end circuit at the related first stage and the second stage respectively, which is a correlated double sample process. By using the differential manner first, and then using the correlated double sample manner, a signal-to-noise ratio of the differential signal output by the differential circuit can be improved.

Optionally, the control circuit 211 includes a first switch set, a second switch set and a third switch set, where the first switch set includes a first switch and a second switch. One end of the first switch is connected to the power supply and the other end is connected to the second switch set, one end of the second switch is grounded and the other end is connected to the second switch set, the second switch set is connected to the two capacitors connected to the front-end circuit, and the third switch set is connected to the (PGA) circuit 212 and the two capacitors connected to the front-end circuit.

Optionally, the first stage includes a first time period and a second time period, and the second stage includes a third time period and a fourth time period.

Optionally, the first switch and the second switch set are turned on in the first time period, the second switch and the third switch set are turned off in the first time period, and the power supply charges the two capacitors connected to the front-end circuit in the first time period (for example, charging up to a power supply voltage $V_{CC}$).

The second switch set in turned off in the second time period, the third switch set is turned on in the second time period, and the two capacitors connected to the front-end circuit discharges to the (PGA) circuit 212 (for example, discharging up to the operating voltage of the (PGA) circuit 212, namely, a common mode voltage $V_{CM}$) in the second time period.

The first switch and the third switch set are turned off in the third time period, the second switch and the second switch set are turned on in the third time period, and voltage signals of the two capacitors connected to the front-end circuit discharge to ground in the third time period (for example, discharging to 0).

The second switch set is turned off in the fourth time period, the third switch set is turned on in the fourth time period, and the (PGA) circuit 212 charges the two capacitors connected to the front-end circuit in the fourth time period (for example, charging up to $V_{CM}$).

For example, it may be fully charged each time and fully discharged each time.

For another example, it is charged up to 80%, and is discharged to 50%; then it continues to be charged up to 80%, and discharged to 50%.

It should be understood that a quantity of times of charging and discharging, and a specific charging amount and a specific discharging amount are not limited in the embodiment of the present disclosure.

As shown in FIG. 3, a front-end circuit 210 includes a control circuit 211 and a (PGA) circuit 212. Optionally, the front-end circuit further includes an analog-to-digital conversion circuit 215. The control circuit 211 includes a first switch set, a second switch set and a third switch set. Optionally, the (PGA) circuit 212 may include a differential amplifier, and switches may also be connected between an input end and an output end of the differential amplifier, such as switches K7 and K8 in FIG. 3. When K7 and K8 exist, a switch state variation of K7 and K8 in each time period, for example, may be the same as a variation of the second switch set.

As shown in FIG. 3, the first switch set includes a first switch K1 and a second switch K2, the second switch set includes a K3 and a K4, and the third switch set includes a K5 and a K6, where the switch K1 in the first switch set is connected to a power supply and the K2 is grounded. Optionally, a switch state of each switch set of the front-end circuit in a detection period may be as shown in Table 1.

TABLE 1

| Switch set | | First stage | | Second stage | |
|---|---|---|---|---|---|
| | | First time period | Second time period | Third time period | Fourth time period |
| First switch set | K1 | Turned on | Turned off/on | Turned off | Turned off/on |
| | K2 | Turned off | Turned off/on | Turned on | Turned off/on |
| Second switch set | K3 | Turned on | Turned off | Turned on | Turned off |
| | K4 | | | | |
| Third switch set | K5 | Turned off | Turned on | Turned off | Turned on |
| | K6 | | | | |

As shown in Table 1, the first stage in the first detection period includes a first time period $t_1$ and a second time period $t_2$.

In the first time period $t_1$ of the detection period, the first switch and the second switch set are turned on, and the second switch and the third switch set are turned off. Since the first switch is connected to the power supply, the power supply charges two capacitors C1 and C2 that are connected to the front-end circuit 210, for example, C1 and C2 are charged up to $V_{cc}$. In this case, since the third switch set is turned off, the (PGA) circuit 212 has no output in the first time period $t_1$, that is, the output $V_{out}$ is 0.

Figure 4:
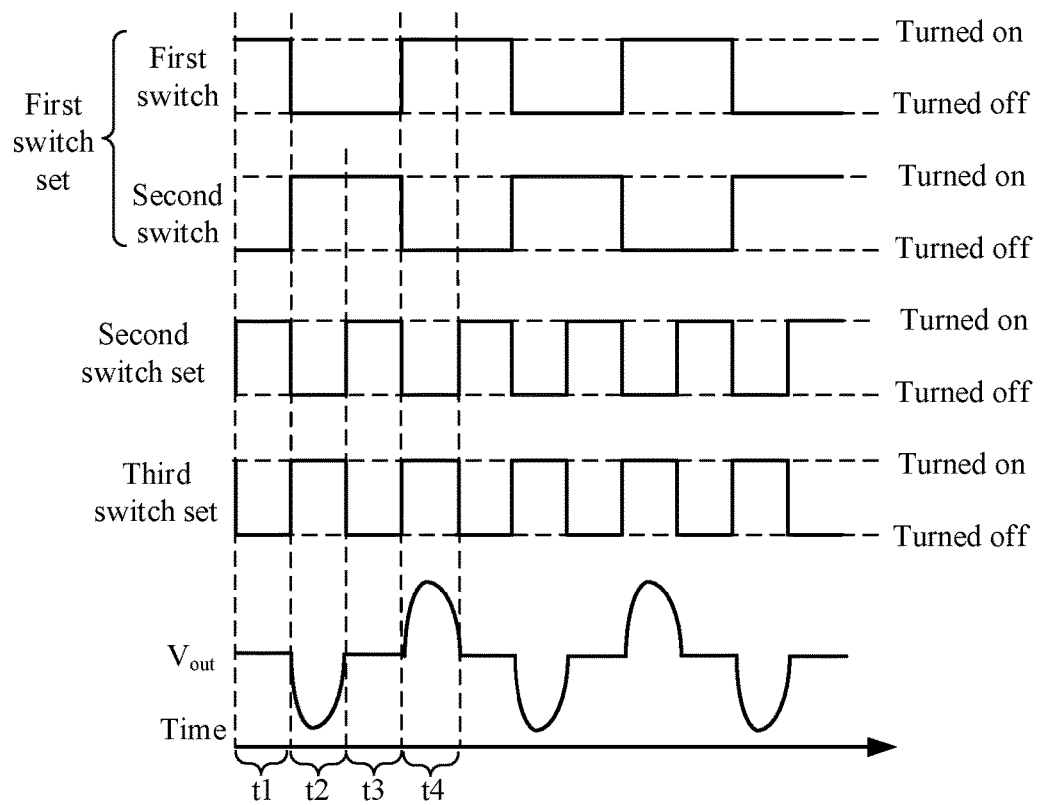
FIG. 4 is a schematic diagram of change in differential signals output by a differential circuit according to an embodiment of the present disclosure.

In the second time period $t_2$ of the detection period, and the second switch set is turned off, and the third switch set is turned on, so that the two capacitors C1 and C2 that are connected to the front-end circuit 210 discharge to the (PGA) circuit 212. In this case, a variation curve of a differential signal $V_{out}$ of voltages corresponding to capacitors C1 and C2 and output by the front-end circuit 210 in the second time period $t_2$ is shown in FIG. 4.

In the third time period $t_3$ of the detection period, the second switch and the second switch set are turned on, and the first switch and the third switch set are turned off. Since the second switch is grounded, the two capacitors C1 and C2 that are connected to the front-end circuit 210 discharge to ground, for example, discharge to $V_{cc}$. In this case, since the third switch set is turned off, the (PGA) circuit 212 has no output in the third time period $t_3$, that is, the output $V_{out}$ is 0.

In the fourth time period $t_4$ of the detection period, and the second switch set is turned off, and the third switch set is turned on, so that the (PGA) circuit charges the two capacitors C1 and C2 that are connected to the front-end circuit 210 in the fourth time period $t_4$, for example, charges up to $V_{CM}$. In this case, as shown in FIG. 4, a variation curve of a differential signal $V_{out}$ of voltages corresponding to capacitors C1 and C2 and output by the front-end circuit 210 in the fourth time period $t_4$ and a variation curve of the $V_{out}$ output in the second time period $t_2$ are the same in value but opposite in direction.

It can be seen that, $V_{out}$ output in the fourth time period $t_4$ is the differential signal $V_{out}$ of voltages corresponding to the two capacitors C1 and C2 that are connected to the front-end circuit 210 during charging by the (PGA) circuit 212, and $V_{out}$ output in the second time period $t_2$ is the differential signal $V_{out}$ of voltages corresponding to the two capacitors C1 and C2 that are connected to the front-end circuit 210 during discharging.

It should be understood that the front-end circuit 210 is only used as an example in illustration of FIG. 3, another front-end circuit adapted to the embodiment of the present disclosure also satisfy the foregoing example described with reference to FIG. 3.

Optionally, the target differential signal of the two capacitors connected to the front-end circuit 210 is a difference between a differential signal of the two capacitors connected to the front-end circuit in the second time period $t_2$ of the first stage and a differential signal of the two capacitors connected to the front-end circuit 210 in the fourth time period $t_4$ of the second stage.

It should be understood that, in the embodiment of the present disclosure, the target differential signal may be a difference between a differential signal of the two capacitors in the first stage and a differential signal of those in the second stage, or may be a target differential signal in another form obtained based on the two differential signals, for example, a difference between the two differential signals is obtained and then divided by 2.

It is assumed that output $V_{out}=V_1+\Delta V$ in the second time period $t_2$, where $V_1$ is a differential signal of voltages corresponding to capacitors C1 and C2, and the output $V_{out}$ carries a noise signal $\Delta V$. Since the fourth time period $t_4$ is related to the second time period $t_2$ in a same detection period, output $V_{out}=(-V1)+\Delta V$ in the fourth time period $t_4$, and the noise signal carried in the output $V_{out}$ may also be considered to be equal to $\Delta V$. Therefore, after a difference between $V_1+\Delta V$ output in the second time period $t_2$ and $(-V1)+\Delta V$ output in the fourth time period $t_4$ is obtained, that is, $(V_1+\Delta V)-[(-V_1+\Delta V)]=2V_1$, the noise signal $\Delta V$ can be canceled, thereby increasing the signal-to-noise ratio of the differential signal output by the differential circuit. Herein, if the target differential signal is only a difference between differential signals of the two capacitors in the second time period $t_2$ and the fourth time period $t_4$, the noise can be canceled, and a signal in 2-fold intensity may also be obtained, that is, $(V_1+\Delta V)-(-V_1+\Delta V)=2V_1$. Certainly, the target differential signal may also be obtained by dividing a difference between differential signals in the second time period $t_2$ and the fourth time period $t_4$ by 2, that is, $[(V_1+$ ΔV)−(−V₁+ΔV)]/2=2V₁/2=V₁, and a target differential signal of the two capacitors with the noise ΔV canceled can also be obtained. This is not limited in the present disclosure.

Optionally, the second time period and the fourth time periods are in an equal length.

Specifically, in a detection period, a fourth time period in which the (PGA) circuit 212 charges the two capacitors connected to the front-end circuit 210 and a second time period in which the two capacitors connected to the front-end circuit 210 discharge to the (PGA) circuit 212 are in an equal length. In the detection period, a length of the first time period and that of the third time period may be equal or not equal, a length of the first time period and that of the second time period may also be equal or not equal, and a length of the third time period and that of the fourth time period may also be equal or not equal. For example, preferably, in a detection period, a first time period, a second time period, a third time period and a fourth time period may be in an equal length; for another example, the second time period and the fourth time period are in an equal length, the first time period and the third time period are in an equal length, and the first time period is smaller than the second time period in length.

Optionally, the front-end circuit 210 further includes a filter circuit 213 and/or an integrator circuit 214, where the filter circuit 213 is configured to filter an interference signal from the target differential signal output by the front-end circuit 210, and the integrator circuit 214 is configured to perform an integral amplification process on the target differential signal output by the front-end circuit 210.

Optionally, the filter circuit 213 and the integrator circuit 214 may be separately disposed in the front-end circuit 210, or may be disposed in the front-end circuit 210 in combination. For example, FIG. 5 describes, as an example, a solution in which the filter circuit 213 and the integrator circuit 214 are disposed in the front-end circuit 210 in combination.

Optionally, the filter circuit 213 may be a low-pass filter.

Optionally, the filter circuit 213 may be an active analog low-pass filter composed of an amplifier, but the embodiment of the present disclosure is not limited thereto.

Optionally, the integrator circuit 214 can amplify a weak capacitance differential signal and increase a signal-to-noise ratio (Signal Noise Ratio, SNR).

Figure 5:
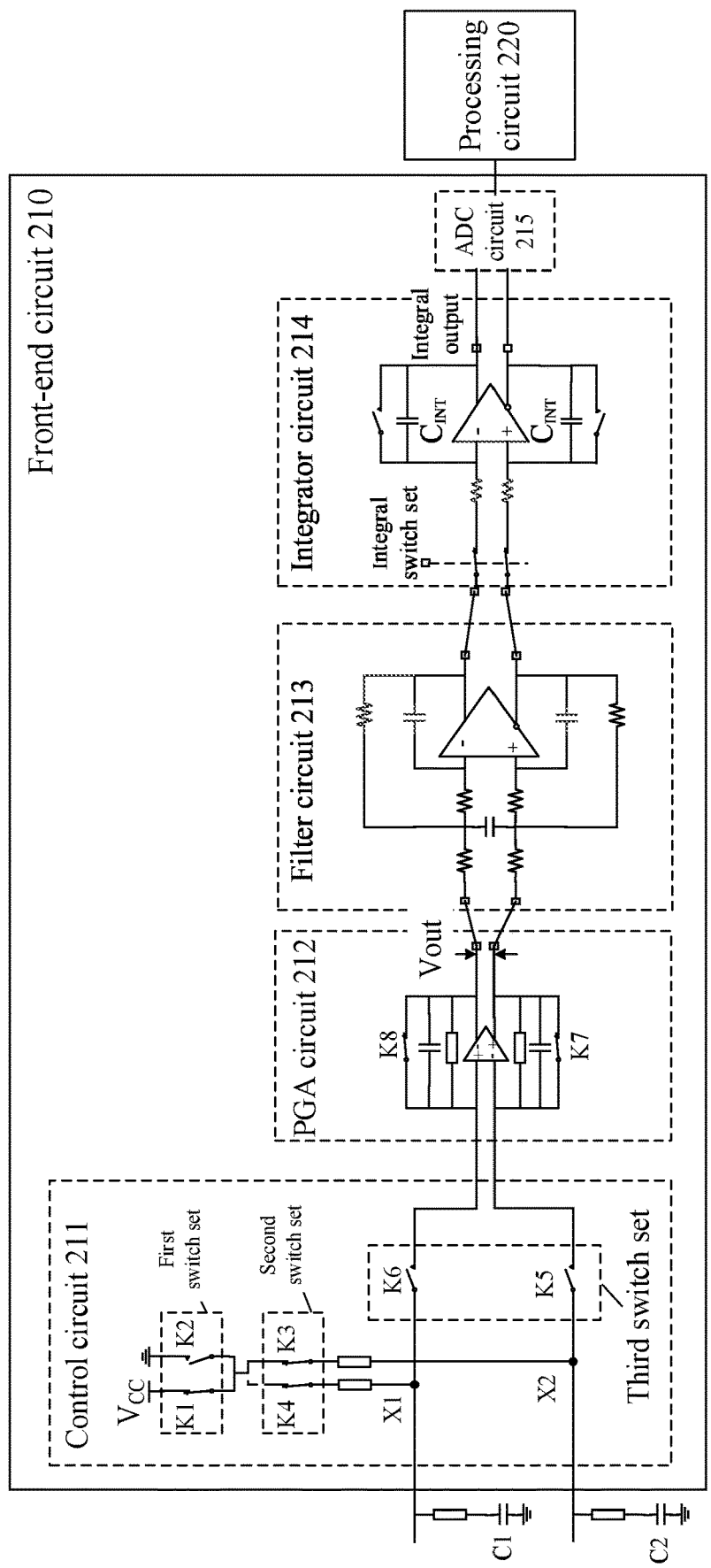
FIG. 5 is a schematic circuit diagram of a front-end circuit according to an embodiment of the present disclosure.

It should be understood that, the integrator circuit 214 shown in FIG. 5 may also integrate and amplify a differential signal output by another front-end circuit that may convert capacitance signals into voltage signals and perform a difference operation on the voltage signals.

It should be understood that, the filter circuit 213 shown in FIG. 5 may also filter interference signal from the differential signals output by the another front-end circuit that may convert capacitance signals into voltage signals and perform a difference operation on the voltage signals.

It should also be understood that, in the embodiment of the present disclosure, when one of the two capacitors C1 and C2 connected to the front-end circuit 210 is a reference capacitor whose capacitance value is known, and the other capacitor is a to-be-detected capacitor, the processing circuit 220 further may be used to determine a capacitance value of the to-be-detected capacitor based on a differential signal output by the front-end circuit 210.

Figure 6:
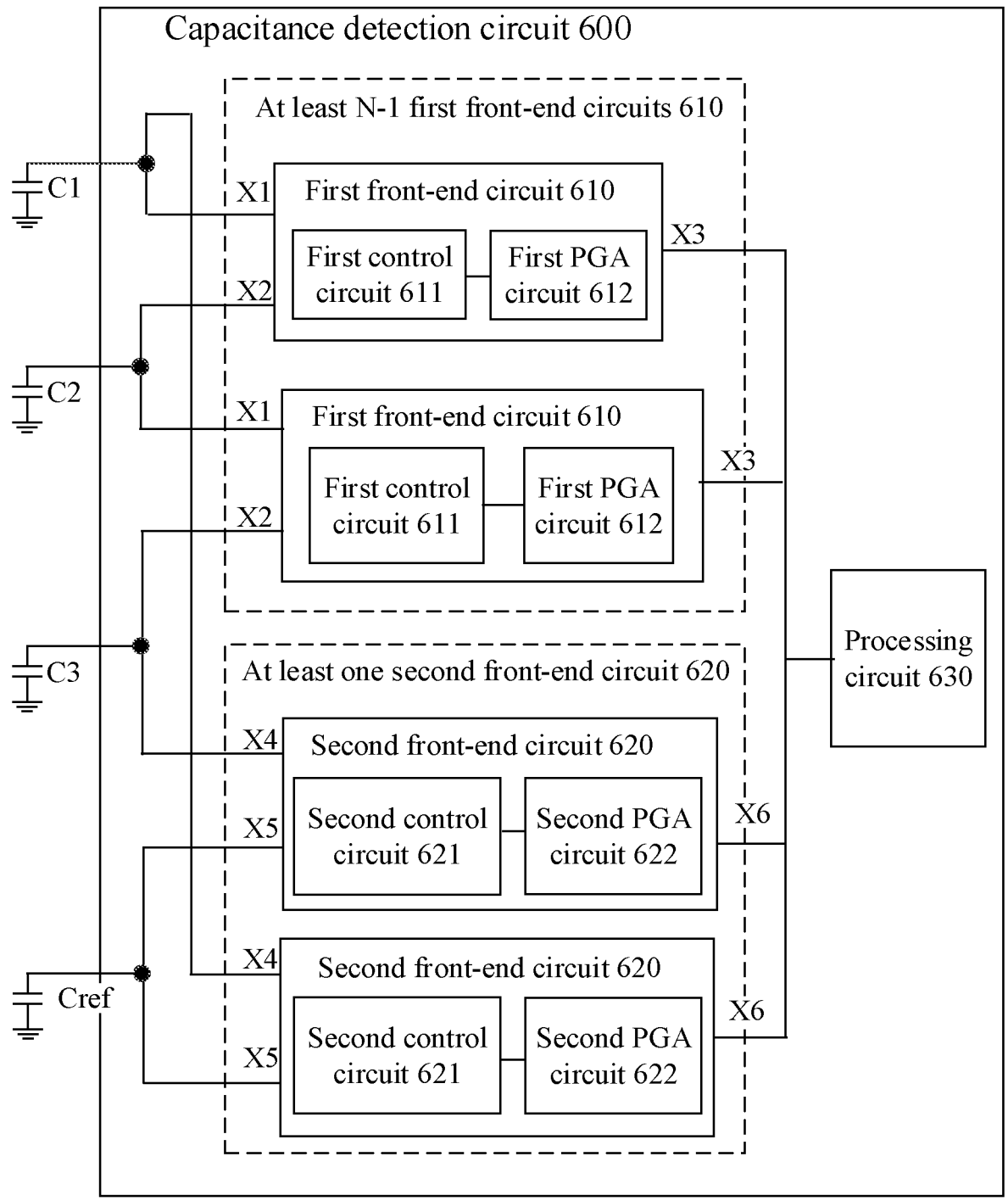
FIG. 6 is a schematic circuit diagram of a capacitance detection circuit according to an embodiment of the present disclosure.
Figure 7:
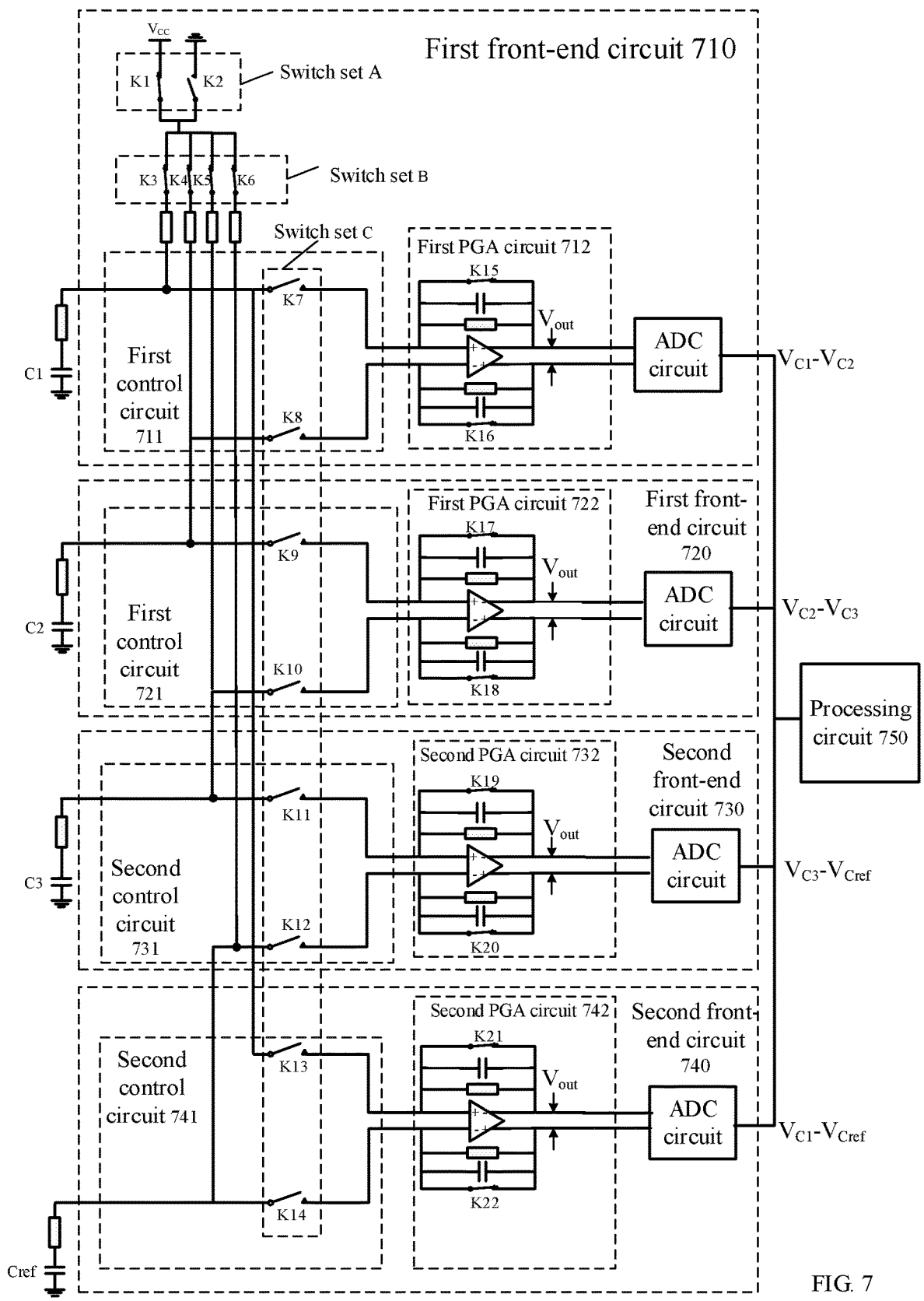
FIG. 7 is a schematic circuit diagram of another capacitance detection circuit according to an embodiment of the present disclosure.

The following will describe a capacitance detection circuit 600 according to an embodiment of the present disclosure in detail with reference to FIG. 6 and FIG. 7.

Optionally, the capacitance detection circuit 600 includes at least one of the differential circuits shown in FIG. 2, which is configured to detect capacitance of N to-be-detected capacitors, where N is greater than or equal to 2.

A quantity of first front-end circuits 610, a quantity of second front-end circuits 620 and a quantity of to-be-detected capacitors are merely used as an example, and the specific quantity is determined according to actual requirement. This embodiment of the present disclosure is not limited hereto.

It should also be understood that, a quantity of to-be-detected capacitors that can be connected to a first input end X1 and a second input end X2 of the first front-end circuit 610 is only an example and is not limited to one. A differential operation may also be performed for a plurality of to-be-detected capacitors. A quantity of to-be-detected capacitors that can be connected to a third input end X4 of the second front-end circuit 620 and a quantity of reference capacitors that can be connected to a fourth input end X5 are only examples and both quantities are not limited to one. A differential operation may also be performed for a plurality of to-be-detected capacitors and reference capacitors. The examples of the present disclosure are not limited thereto.

Specifically, as shown in FIG. 6, for example, the capacitance detection circuit includes:

at least N−1 first front-end circuits 610 that convert capacitance signals of the to-be-detected capacitors into first voltage signals and that perform a difference operation on the first voltage signals, at least one second front-end circuit 620 that convert capacitance signals of the to-be-detected capacitors into second voltage signals and that perform a difference operation on the second voltage signals, and a processing circuit 630.

Each of the at least N−1 first front-end circuits 610 includes a first input end X1 and a second input end X2, and each of the at least one second front-end circuit 620 includes a third input end X4 and a fourth input end X5.

The first input end X1 and the second input end X2 of each of the at least N−2 first front-end circuits 610 are connected to two different to-be-detected capacitors respectively.

A first input end X1 of a first front-end circuit 610 other than the at least N−2 first front-end circuits 610 is connected to both a third input end X4 of a second front-end circuit 620 and a to-be-detected capacitor, a second input end X2 of the first front-end circuit 610 other than the at least N−2 first front-end circuits 610 is connected to both a first input end X1 of a first front-end circuit 610 of the at least N−2 first front-end circuits 610 and a to-be-detected capacitor, and the to-be-detected capacitors connected to the two input ends of the first front-end circuit 610 other than the at least N−2 first front-end circuits 610 are different to-be-detected capacitors.

Further, optionally, each of the first front-end circuits 610 includes a first control circuit 611 and a first programmable gain amplification (PGA) circuit. The first control circuit is connected to a power supply, the two to-be-detected capacitors connected to the first front-end circuit 610 and the first (PGA) circuit 612.

The first control circuit 611 is configured to control the two to-be-detected capacitors connected to the first front-end circuit 610 discharge to the first (PGA) circuit 612 in at a first stage of a detection period, and control the first (PGA) circuit 612 to charge the two to-be-detected capacitors connected to the first front-end circuit 610 at a second stage of the detection period.

The first (PGA) circuit 612 is configured to convert, at the first stage and the second stage respectively, the capacitance signals of the two to-be-detected capacitors connected to the first front-end circuit 610 into the first voltage signals and perform a difference operation on the first voltage signals of the two to-be-detected capacitors connected to the first front-end circuit 610, to obtain a first differential signal of voltages corresponding to the two to-be-detected capacitors connected to the first front-end circuit 610 at the first stage and a first differential signal corresponding to the two to-be-detected capacitors connected to the first front-end circuit 610 at the second stage.

The third input end X4 of each of the at least one second front-end circuit 620 is connected to a to-be-detected capacitor, and the fourth input end X5 is connected to a reference capacitor.

Further, optionally, each of the second front-end circuits 620 includes a second control circuit 621 and a second (PGA) circuit 622. The second control circuit 621 is connected to the power supply, the second (PGA) circuit 622, the to-be-detected capacitor and the reference capacitor that are connected to the second front-end circuit 620.

The second control circuit 621 is configured to control the to-be-detected capacitor and the reference capacitor that are connected to the second front-end circuit 620 discharge to the second (PGA) circuit at the first stage, and control the second (PGA) circuit 622 to charge the to-be-detected capacitor and the reference capacitor that are connected to the second front-end circuit 620 at the second stage.

The second (PGA) circuit 621 is configured to convert, at the first stage and the second stage respectively, the capacitance signals of the to-be-detected capacitor and the reference capacitor that are connected to the first front end circuit 620 into the second voltage signals and perform a difference operation on the second voltage signals of the to-be-detected capacitor and the reference capacitor that are connected to the second front end circuit 620, to obtain a second differential signal of voltages corresponding to the to-be-detected capacitor and the reference capacitor that are connected to the second front end circuit 620 at the first stage and a second differential signal of voltages corresponding to the to-be-detected capacitor and the reference capacitor that are connected to the second front end circuit 610 at the second stage.

Each of the at least N−1 first front-end circuits 610 outputs a first differential signal of the two to-be-detected capacitors connected to the first front-end circuit 610 at the first stage and outputs a first differential signal of the two to-be-detected capacitors connected to the first front-end circuit 610 at the second stage.

Each of the at least one second front-end circuits 620 outputs a second differential signal of the to-be-detected capacitor and reference capacitor that are connected to the second front-end circuit 620 at the first stage and outputs a second differential signal of the to-be-detected capacitor and reference capacitor that are connected to the second front-end circuit 620 at the second stage.

The processing circuit 630 is connected to an output end of each first front-end circuit 610 and an output end of each second front-end circuit 620 and is configured to: determine, according to the first differential signal output by the first front-end circuit 610 at the first stage and the first differential signal output by the first front-end circuit 610 at the second stage, a target differential signal of voltages corresponding to the two to-be-detected capacitors connected to the first front-end circuit 610; determine, according to the second differential signal output by the second front-end circuit 620 at the first stage and the second differential signal output by the second front-end circuit 620 at the second stage, a target differential signal of voltages corresponding to the to-be-detected capacitor and the reference capacitor that are connected to the second front-end circuit 620; and determine, according to the target differential signal of the two to-be-detected capacitors connected to the first front-end circuit 610 and the target differential signal of the to-be-detected capacitor and the reference capacitor that are connected to the second front-end circuit 620, a capacitance value of each of the N to-be-detected capacitors.

Therefore, in a capacitance detection circuit, a first front-end circuit outputs, to a processing circuit, a first differential signal of voltages corresponding to two to-be-detected capacitors connected to the first front-end circuit, and a second front-end circuit outputs, to the processing circuit, the first differential signal of voltages corresponding to a to-be-detected capacitor and a reference capacitor that are connected to the second front-end circuit, which is a differential process; a first control circuit controls the two to-be-detected capacitors to discharge to a first (PGA) circuit at the first stage, and controls the first (PGA) circuit to charge the two to-be-detected capacitors at the second stage related to the first stage, and a second control circuit controls the to-be-detected capacitor and the reference capacitor to discharge to a second (PGA) circuit at the first stage, and controls the second (PGA) circuit to charge the to-be-detected capacitor and the reference capacitor at the second stage, which is a correlated double sample process. The processing circuit determines, according to the first differential signals output by the front-end circuit at the first stage and the second stage respectively, a target differential signal of the two to-be-detected capacitors connected to the first front-end circuit, the processing circuit determines, according to the second differential signals output by the front-end circuit at the first stage and the second stage respectively, a target differential signal of the to-be-detected capacitor and the reference capacitor that are connected to the second front-end circuit, and the processing circuit determines, according to the target differential signal of the two to-be-detected capacitors connected to the first front-end circuit and the target differential signal of the to-be-detected capacitor and the reference capacitor that are connected to the second front-end circuit, a capacitance value of each of the N to-be-detected capacitors. By using the differential manner first, and then using the double correlation sampling manner, a signal-to-noise ratio of the differential signal can be improved, thereby improving accuracy of capacitance detection.

It should be understood that, for detailed descriptions of each first front-end circuit and each second front-end circuit in the capacitance detection circuit shown in FIG. 6, reference may be made to the descriptions of the differential circuit shown FIG. 2 to FIG. 5. For simplicity, repeated description is omitted herein.

Optionally, when the capacitance detecting circuit is used in a touch detection apparatus, the processing circuit 630 may further implement a function of coordinate positioning for user touch position on the basis of determining a capacitance value of each of the N to-be-detected capacitors.

Optionally, each of the N to-be-detected capacitors is a capacitor formed between an electrode of a touch channel and ground.

It also should be understood that, the foregoing connecting means that a signal (such as a capacitance signal, a voltage signal, a first differential signal, a second differential signal and the like) may be transmitted, does not necessarily mean a physical connection, and the connecting in subsequent descriptions has the same meaning.

Optionally, the first control circuit 611 includes a first switch set, a second switch set and a third switch set, the first switch set includes a first switch and a second switch, one end of the first switch is connected to the power supply and the other end of the first switch is connected to the second switch set, one end of the second switch is grounded and the other end of the second switch is connected to the second switch set, the second switch set is connected to the two to-be-detected capacitors connected to the first front-end circuit, and the third switch set is connected to the first (PGA) circuit 612 and the two to-be-detected capacitors connected to the first front-end circuit 610.

Optionally, the first stage includes a first time period and a second time period, and the second stage includes a third time period and a fourth time period.

Optionally, the first switch and the second switch set are turned on during the first time period, the second switch and the third switch set are turned off during the first time period, and the power supply charges the two to-be-detected capacitors connected to the first front-end circuit 610 in the first time period.

The second switch set is turned off during the second time period, the third switch set is turned on during the second time period, and the two to-be-detected capacitors connected to the first front-end circuit 610 discharges to the first (PGA) circuit 612 in the second time period.

The first switch and the third switch set are turned off during the third time period, the second switch and the second switch set are turned on during the third time period, and the first voltage signals of the two to-be-detected capacitors connected to the first front-end circuit 610 discharge to ground in the third time period.

The second switch set is turned off during the fourth time period, the third switch set is turned on during the fourth time period, and the first (PGA) circuit 612 charges the two to-be-detected capacitors connected to the first front-end circuit 610 in the fourth time period.

Optionally, the second control circuit 621 includes a fourth switch set, a fifth switch set and a sixth switch set, the fourth switch set includes a third switch and a fourth switch, one end of the third switch is connected to the power supply and the other end of the third switch is connected to the fifth switch set, one end of the fourth switch is grounded and the other end of the fourth switch is connected to the fifth switch set, the fifth switch set is connected to the to-be-detected capacitor and the reference capacitor that are connected to the second front-end circuit, and the sixth switch set is connected to the second (PGA) circuit 622 and the to-be-detected capacitor and the reference capacitor that are connected to the second front-end circuit.

Optionally, the first stage includes a first time period and a second time period, and the second stage includes a third time period and a fourth time period.

Optionally, the third switch and the fifth switch set are turned on during the first time period, and the fourth switch and the sixth switch set are turned off during the first time period, and the power supply charges the to-be-detected capacitor and the reference capacitor that are connected to the second front-end circuit 620 in the first time period.

The fifth switch set is turned off during the second time period, the sixth switch set is turned on during the second time period, and the to-be-detected capacitor and the reference capacitor that are connected to the second front-end circuit 620 discharges to the second (PGA) circuit 622 in the second time period.

The third switch and the six switch set are turned off during the third time period, the fourth switch and the fifth switch set are turned on during the third time period, and the first voltage signals of the to-be-detected capacitor and the reference capacitor that are connected to the second front-end circuit 620 discharge to ground in the fourth time period.

The fifth switch set is turned off during the fourth time period, the sixth switch set is turned on during the fourth time period, and the second (PGA) circuit 622 charges the to-be-detected capacitor and the reference capacitor that are connected to the second front-end circuit 620 in the fourth time period.

Optionally, the fourth switch set and the first switch set are a same switch set or a different switch set, and when the fourth switch set and the first switch set are a same switch set, the third switch and the first switch are a same switch and the fourth switch and the second switch are a same switch.

Optionally, first switch sets in the first control circuit of at least part of the at least N−1 first front-end circuits are a same switch set, and/or fourth switch sets in the second control circuit of at least part of the at least one second front-end circuit are a same switch set.

Optionally, the first front-end circuit 610 further includes a filter circuit 613 and/or an integrator circuit 614, where the filter circuit 613 is configured to filter an interference signal from the target differential signal output by the first front-end circuit 610, and the integrator circuit 614 is configured to perform an integral amplification process on the target differential signal output by the first front-end circuit 610.

It should be understood that, the first filter circuit 613 may also filter interference signal from the first differential signals output by another first front-end circuit that may convert capacitance signals into first voltage signals and perform a difference operation on the first voltage signals.

It should be understood that, the first integrator circuit 614 may also integrate and amplify first differential signal output by another first front-end circuit that may convert capacitance signals into first voltage signals and perform a difference operation on the first voltage signals.

Optionally, the front-end circuit 620 further includes a second filter circuit 623 and/or a second integrator circuit 624, where the second filter circuit 623 is configured to filter an interference signal from the target differential signal output by the second front-end circuit 620, and the second integrator circuit 624 is configured to perform an integral amplification process on the target differential signal output by the second front-end circuit 620.

It should be understood that, the second filter circuit 623 may also filter interference signal from the second differential signals output by another second front-end circuit that may convert capacitance signals into second voltage signals and perform a difference operation on the second voltage signals.

It should be understood that, the second integrator circuit 624 may also integrate and amplify second differential signal output by another second front-end circuit that may convert capacitance signals into second voltage signals and perform a difference operation on the second voltage signals.

The following uses N=3 as an example to describe a possible capacitance detection circuit of an embodiment of the present disclosure in detail with reference to FIG. 7.

The capacitance detection circuit 700 shown in FIG. 7 is configured to detect N to-be-detected capacitors, where N=3. The capacitor detection circuit 700 includes a first front-end circuit 710 and a first front-end circuit 720; a second front-end circuit 730 and a second front-end circuit 740; three to-be-detected capacitors denoted as C1, C2, and C3 respectively; and one reference capacitor denoted as Cref.

The first front-end circuit 710 is connected to the to-be-detected capacitor C1 and the to-be-detected capacitor C2. The first front-end circuit 720 is connected to the to-be-detected capacitor C2 and the to-be-detected capacitor C3. The second front-end circuit 730 is connected to the to-be-detected capacitor C3 and the reference capacitor Cref, and the second front-end circuit 740 is connected to the to-be-detected capacitor C1 and the reference capacitor Cref.

The first front-end circuit 710 includes a first control circuit 711 and a first (PGA) circuit 712; the first front-end circuit 720 includes a first control circuit 721 and a first (PGA) circuit 722; the second front-end circuit 730 includes a second control circuit 731 and a second (PGA) circuit 732; and the second front-end circuit 740 includes a second control circuit 741 and a second (PGA) circuit 742.

Each of the first control circuits includes a first switch set, a second switch set, and a third switch set, and each of the second control circuits includes a fourth switch set, a fifth switch set, and a sixth switch set.

The first switch set of the first control circuit 711, the first switch set of the first control circuit 721, the fourth switch set of the second control circuit 731, and the fourth switch set of the second control circuit 741 are a same switch set. In other words, the first control circuit 711, the first control circuit 721, the second control circuit 731, and the second control circuit 741 share a same switch set, which is denoted as switch set A, including switches K1 and K2, and K1 is connected to a power supply, and K2 is grounded.

Optionally, the voltage source may be a 1.2V DC voltage source, or a 2.4V DC voltage source, or a 5.0V DC voltage source. Optionally, each of the first front-end circuits and/or the second front-end circuits may be connected to a DC voltage source, or all of the first front-end circuits and/or all of the second front-end circuits may be connected to a DC voltage source.

The second switch set of the first control circuit 711, the second switch set of the first control circuit 721, the fifth switch set of the second control circuit 731, and the fifth switch set of the second control circuit 741 are combined into one switch set, which is denoted as switch set B, including switches K3, K4, K5, and K6.

The third switch set of the first control circuit 711, the third switch set of the first control circuit 721, the sixth switch set of the second control circuit 731, and the sixth switch set of the second control circuit 741 are combined into one switch set, which is denoted as switch set C, including switches K7 to K14.

During a first time period $t_1$ at a first stage of a detection period, the switch K1 and the switch set B are turned on, the switch K2 and the switch set C are turned off. Since the switch K1 is connected to the power supply, the power supply charges the to-be-detected capacitors C1, C2 and C3, and $C_{ref}$, for example, charges up to power supply voltage $V_{cc}$. In this case, there is no output in the first time period $t_1$, that is, the output $V_{out}=0$.

During a second time period $t_2$ at the first stage of the detection period, the switch set B is turned off, the switch set C is turned on, and the to-be-detected capacitors C1, C2, and C3, and $C_{ref}$ discharge to the first (PGA) circuit 722 (for example, discharge to $V_{CM}$). In this case, a differential signal of voltages corresponding to the to-be-detected capacitors C1 and C2 output by the first front-end circuit 710 satisfies $V_{out}=V_1+\Delta V_1$, $V_1=V_{C1}-V_{C2}$; a differential signal of voltages corresponding to the to-be-detected capacitors C2 and C3 output by the first front-end circuit 720 satisfies $V_{out}=V_2+\Delta V_2$, $V_2=V_{C2}-V_{C3}$; a differential signal of voltages corresponding to the to-be-detected capacitor C3 and $C_{ref}$ output by the second front-end circuit 730 satisfies $V_{out}=V_3+\Delta V_3$, $V_3=V_{C3}-V_{Cref}$; and a differential signal of voltages corresponding to the to-be-detected capacitor C1 and $C_{ref}$ output by the second front-end circuit 740 satisfies $V_{out}=V_4+\Delta V_4$, $V_4=V_{C1}-V_{Cref}$. $\Delta V_1$, $\Delta V_2$, $\Delta V_3$, and $\Delta V_4$ are noise carried by signals, and $\Delta V_1$, $\Delta V_2$, $\Delta V_3$, and $\Delta V_4$ may be equal or not equal.

During a third time period $t_3$ at a second stage of the detection period, the switch K2 and the switch set B are turned on, the switch K1 and the switch set C are turned off. Since the switch K2 is grounded, the to-be-detected capacitors C1, C2 and C3, and $C_{ref}$ discharge to ground to 0. In this case, the voltage output in the third time period $t_3$ satisfies $V_{out}=0$.

During a fourth time period $t_4$ at the second stage of the detection period, the switch set B is turned off, and the switch set C is turned on, so that the first (PGA) circuit 712 charges the to-be-detected capacitors C1 and C2 (for example, charges up to $V_{CM}$) in the fourth time period $t_4$, the first (PGA) circuit 722 charges the to-be-detected capacitors C2 and C3 (for example, charges up to $V_{CM}$) in the fourth time period $t_4$, the second (PGA) circuit 732 charges the to-be-detected capacitor C3 and $C_{ref}$ (for example, charges up to $V_{CM}$) in the fourth time period $t_4$, and the second (PGA) circuit 742 charges the to-be-detected capacitor C1 and $C_{ref}$ (for example, charges up to $V_{CM}$) in the fourth time period $t_4$. In this case, a variation curve of a differential signal $V_{out}$ corresponding to the to-be-detected capacitors in the fourth time period $t_4$ and a variation curve of $V_{out}$ in the second time period $t_2$ are the same in value but opposite in direction. A differential signal of voltages corresponding to the to-be-detected capacitors C1 and C2 output by the first front-end circuit 710 satisfies $V_{out}=(-V_1)+\Delta V_1$, $V_1=V_{C1}-V_{C2}$; a differential signal of voltages corresponding to the to-be-detected capacitors C2 and C3 output by the first front-end circuit 720 satisfies $V_{out}=(-V_2)+\Delta V_2$, $V_2=V_{C2}-V_{C3}$; a differential signal of voltages corresponding to the to-be-detected capacitor C3 and $C_{ref}$ output by the second front-end circuit 730 satisfies $V_{out}=(-V_3)+\Delta V_3$, $V_3=V_{C3}-V_{Cref}$; and a differential signal of voltages corresponding to the to-be-detected capacitor C1 and $C_{ref}$ output by the second front-end circuit 740 satisfies $V_{out}=(-V_4)+\Delta V_4$, $V_4=V_{C1}-V_{Cref}$.

It can be seen that, $V_{out}=(-V_1)+\Delta V_1$ output by the first front-end circuit 710 in the fourth time period $t_4$ is the differential signal obtained when the (PGA) circuit 712 charges the two to-be-detected capacitors C1 and C2 that are connected to the first front-end circuit 710, and $V_{out}=V_1+\Delta V_1$ output by the first front-end circuit 710 in the second time period $t_2$ is the differential signal obtained when the two to-be-detected capacitors C1 and C2 that are connected to the first front-end circuit 710 discharge. Since a second time period $t_2$ and a fourth time period $t_4$ in a same detection period are associated, a noise carried in the $V_{out}$ output by the first front-end circuit 710 in the second time period $t_2$ is mostly considered to be same as that carried in the $V_{out}$ output in the fourth time period $t_4$, and both are $\Delta V_1$. Therefore, after a difference operation is performed on the $V_{out}=V_1+\Delta V_1$ output by the first front-end circuit 710 in the second time period $t_2$ and the $V_{out}=(-V_1)+\Delta V_1$ output in the fourth time period $t_4$, that is, $(V_1+\Delta V_1)-[(-V_1)+\Delta V_1]=2V_1=2(V_{C1}-V_{C2})$, a noise signal $\Delta V_1$ can be canceled, thereby improving a signal-to-noise ratio of a differential signal output by the differential circuit, and obtaining a more accurate target differential signal $V_{C1}-V_{C2}$ of the to-be-detected capacitors C1 and C2. A difference $(V_{C1}-V_{C2})$ of first voltage signals that are converted from capacitance signals of C1 and C2 is proportional to a difference (C1−C2) of the capacitance signals of C1 and C2.

$V_{out}=(-V_2)+\Delta V_2$ output by the first front-end circuit 720 in the fourth time period $t_4$ is the differential signal obtained when the (PGA) circuit 722 charges the two to-be-detected capacitors C2 and C3 that are connected to the first front-end circuit 720, and $V_{out}=V_2+\Delta V_2$ output by the first front-end circuit 720 in the second time period $t_2$ is the differential signal obtained when the two to-be-detected capacitors C2 and C3 that are connected to the first front-end circuit 720 discharge. Since a second time period $t_2$ and a fourth time period $t_4$ in a same detection period are associated, a noise carried in the $V_{out}$ output by the first front-end circuit 720 in the second time period $t_2$ is mostly considered to be same as that carried in the $V_{out}$ output in the fourth time period $t_4$, and both are $\Delta V_2$. Therefore, after a difference operation is performed on the $V_{out}=V_2+\Delta V_2$ output by the first front-end circuit 720 in the second time period $t_2$ and the $V_{out}=(-V_2)+\Delta V_2$ output in the fourth time period $t_4$, that is, $(V_2+\Delta V_2)-[(-V_2)+\Delta V_2]=2V_2=2(V_{C2}-V_{C3})$, a noise signal $\Delta V_2$ can be canceled, thereby improving a signal-to-noise ratio of a differential signal output by the differential circuit, and obtaining a more accurate target differential signal $V_{C2}-V_{C3}$ of the to-be-detected capacitors C2 and C3. A difference $(V_{C2}-V_{C3})$ of first voltage signals that are converted from capacitance signals of C2 and C3 is proportional to a difference (C2−C3) of the capacitance signals of C2 and C3.

$V_{out}=(-V_3)+\Delta V_3$ output by the second front-end circuit 730 in the fourth time period $t_4$ is the differential signal obtained when the second (PGA) circuit 732 charges the to-be-detected capacitor C3 and the reference capacitor $C_{ref}$ that are connected to the second front-end circuit 730, and $V_{out}=V_3+\Delta V_3$ output by the second front-end circuit 730 in the second time period $t_2$ is the differential signal obtained when the to-be-detected capacitors C3 and the reference capacitor $C_{ref}$ that are connected to the second front-end circuit 730 discharge. Since a second time period $t_2$ and a fourth time period $t_4$ in a same detection period are associated, a noise carried in the $V_{out}$ output by the second front-end circuit 730 in the second time period $t_2$ is mostly considered to be same as that carried in the $V_{out}$ output in the fourth time period $t_4$, and both are $\Delta V_3$. Therefore, after a difference operation is performed on the $V_{out}=V_3+\Delta V_3$ output by the second front-end circuit 730 in the second time period $t_2$ and the $V_{out}=(-V_3)+\Delta V_3$ output in the fourth time period $t_4$, that is, $(V_3+\Delta V_3)-[(-V_3)+\Delta V_3]=2V_3=2(V_{C3}-V_{Cref})$, a noise signal $\Delta V_3$ can be canceled, thereby improving a signal-to-noise ratio of a differential signal output by the differential circuit, and obtaining a more accurate target differential signal $V_{C3}-V_{Cref}$ of the to-be-detected capacitor C3 and the reference capacitor $C_{ref}$. A difference $(V_{C3}-V_{Cref})$ of first voltage signals that are converted from capacitance signals of C3 and $C_{ref}$ is proportional to a difference (C3−$C_{ref}$) of the capacitance signals of C3 and $C_{ref}$.

$V_{out}=(-V_4)+\Delta V_4$ output by the second front-end circuit 740 in the fourth time period $t_4$ is the differential signal obtained when the second (PGA) circuit 742 charges the to-be-detected capacitor C1 and the reference capacitor $C_{ref}$ that are connected to the second front-end circuit 740, and $V_{out}=V_4+\Delta V_4$ output by the second front-end circuit 740 in the second time period $t_2$ is the differential signal obtained when the to-be-detected capacitors C1 and the reference capacitor $C_{ref}$ that are connected to the second front-end circuit 740 discharge. Since a second time period $t_2$ and a fourth time period $t_4$ in a same detection period are associated, a noise carried in the $V_{out}$ output by the second front-end circuit 740 in the second time period $t_2$ is mostly considered to be same as that carried in the $V_{out}$ output in the fourth time period $t_4$, and both are $\Delta V_4$. Therefore, after a difference operation is performed on the $V_{out}=V_4+\Delta V_4$ output by the second front-end circuit 740 in the second time period $t_2$ and the $V_{out}=(-V_4)+\Delta V_4$ output in the fourth time period $t_4$, that is, $(V_4+\Delta V_4)-[(-V_4)+\Delta V_4]=2V_4=2(V_{C1}-V_{Cref})$, a noise signal $\Delta V_4$ can be canceled, thereby improving a signal-to-noise ratio of a differential signal output by the differential circuit, and obtaining a more accurate target differential signal $V_{C1}-V_{Cref}$ of the to-be-detected capacitor C1 and the reference capacitor $C_{ref}$. A difference $(V_{C1}-V_{Cref})$ of first voltage signals that are converted from capacitance signals of C1 and $C_{ref}$ is proportional to a difference (C1−$C_{ref}$) of the capacitance signals of C1 and $C_{ref}$.

It is assumed that the first front-end circuit 710 outputs a first differential signal a ($V_{C1}-V_{C2}=a$) of voltages corresponding to C1 and C2, the first front-end circuit 720 outputs a first differential signal b ($V_{C2}-V_{C3}=b$) of voltages corresponding to C2 and C3, the second front-end circuit 730 outputs a second differential signal c ($V_{C3}-V_{Cref}=c$) of voltages corresponding to C3 and Cref, and the second front-end circuit 740 outputs a second differential signal d ($V_{C1}-V_{Cref}=d$) of voltages corresponding to C1 and $C_{ref}$.

The processing circuit 750 may obtain the first differential signals (a, b) and the second differential signals (c, d) based on the above process and solve for V1, V2, and V3.

$V_{C1}$, $V_{C2}$, and $V_{C3}$ are in one-to-one correspondence with C1, C2, and C3, and C1, C2, and C3 can be obtained according to $V_{C1}$, $V_{C2}$, and $V_{C3}$.

Specifically, $V_{C1}$, $V_{C2}$, and $V_{C3}$ may be obtained according to the following equations:

$$V_{C1}-V_{C2}=a;$$

$$V_{C2}-V_{C3}=b;$$

$$V_{C3}-V_{Cref}=c; \text{ and}$$

$$V_{C1}-V_{Cref}=d.$$

a, b, c, and d may be obtained by the processing circuit 750, $V_{C1}=d+V_{Cref}$, $V_{C2}=V_{C1}+a$, and $V_{C3}=V_{C2}+b$, and $V_{C3}=c+V_{Cref}$ may be used to verify whether the circuit is working correctly. $V_{C1}$, $V_{C2}$, and $V_{C3}$ correspond to C1, C2, and C3, respectively. C1, C2, and C3 may be obtained based on $V_{C1}$, $V_{C2}$, and $V_{C3}$.

Alternatively, a sum formula $V_{C1}+V_{C3}=c+d+2V_{Cref}$ may be obtained according to $V_{C3}-V_{Cref}=c$ and $V_{C1}-V_{Cref}=d$, and $V_{C1}$, $V_{C2}$, $V_{C3}$ are solved according to the following equation set:

$$V_{C1}-V_{C2}=a;$$

$$V_{C2}-V_{C3}=b; \text{ and}$$

$$V_{C1}+V_{C3}=c+d+2\ V_{Cref}.$$

Optionally, each of the first front-end circuits may further include an analog-to-digital conversion circuit for performing analog-to-digital conversion on each of the first front-end circuits.

Optionally, each of the second front-end circuits may further include an analog-to-digital conversion circuit for performing analog-to-digital conversion on each of the second front-end circuits.

Further, each of the first front-end circuit further includes a first filter circuit and/or a first integrator circuit, where a first filter circuit of each of the first front-end circuits is configured to filter an interference signal from the target differential signal output by the first front-end circuit, and the first integrator circuit of each of the first front-end circuits is configured to perform an integral amplification process on the target differential signal output by the first front-end circuit.

Further, each of the second front-end circuit further includes a second filter circuit and/or a second integrator circuit, where a second filter circuit of each second front-end circuits is configured to filter an interference signal from the target differential signal output by the second front-end circuit, and the first integrator circuit of each second front-end circuit is configured to perform an integral amplification process on the target differential signal output by each second front-end circuit.

Figure 8:
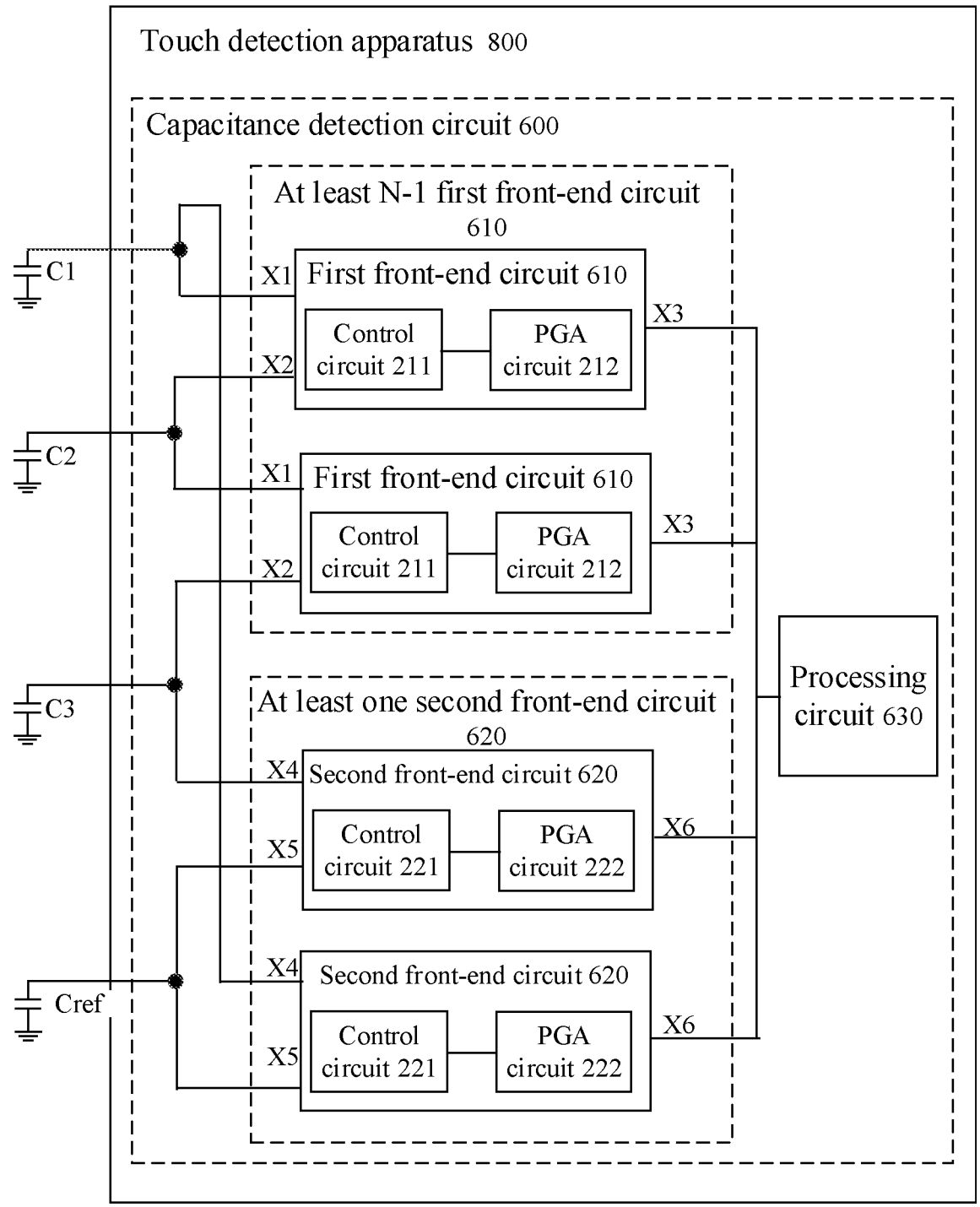
FIG. 8 is a schematic circuit diagram of a touch detection device according to an embodiment of the present disclosure.

FIG. 8 is a schematic circuit diagram of a touch detection apparatus 800 according to an embodiment of this application.

As shown in FIG. 8, the touch detection device 800 includes a capacitance detection circuit 600 shown in FIG. 6 or a capacitance detection circuit 700 shown in FIG. 7.

The touch detection apparatus 800 is configured to determine a touch position of a user according to capacitance values of N to-be-detected capacitors determined by the capacitance detection circuit.

Optionally, each of the N to-be-detected capacitors is a capacitor formed between an electrode of a touch channel and ground.

Therefore, in the touch detection apparatus of the embodiment of the present disclosure, the touch detection apparatus may determine the touch position of the user according to the capacitance values of the N to-be-detected capacitors obtained by the capacitance detection circuit through differential operation, double correlation sampling, and reduction, so that the position that the user touches on the touch detection apparatus can be more accurately determined.

Optionally, a shape of an electrode of the N to-be-detected capacitors in the embodiments of the present disclosure may be triangular or matrix.

Figure 9:
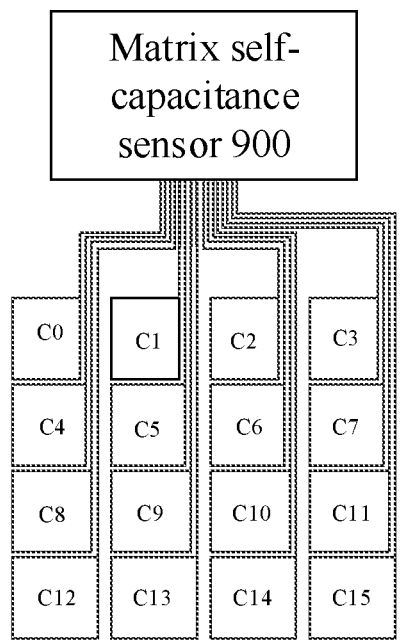
FIG. 9 shows a matrix type self-contained sensor that is applied to an embodiment of the present disclosure.

For example, FIG. 9 shows a matrix self-capacitance sensor 900, and the matrix self-capacitance sensor 900 can determine a capacitance value of each matrix self-capacitance sensor by using the capacitance detection circuit 600 shown in FIG. 6 or the capacitance detection circuit 700 shown in FIG. 7, and also can determine a touch position of a user on the matrix self-capacitance sensor 900 by using the touch detection apparatus 800 shown in FIG. 8.

It should be understood that the matrix self-capacitance sensor 900 is a capacitive touch screen sensor (Sensor) that only needs self-capacitance.

Figure 10:
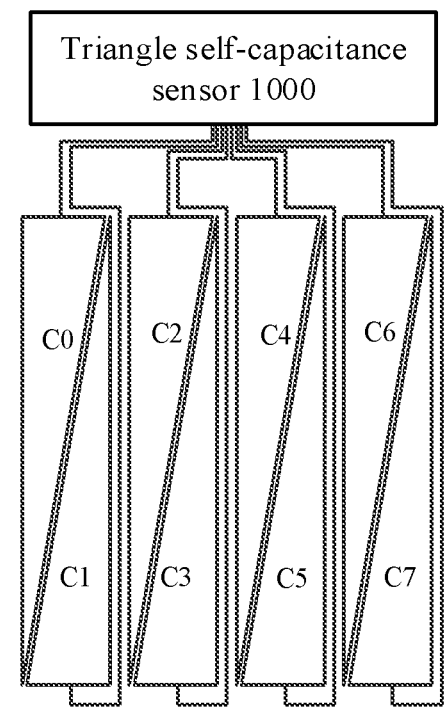
FIG. 10 shows a triangular self-contained sensor that is applied to an embodiment of the present disclosure.

For another example, FIG. 10 shows a triangle self-capacitance sensor 1000, and the triangle self-capacitance sensor 1000 can determine a capacitance value of each triangle self-capacitance sensor by using the capacitance detection circuit 600 shown in FIG. 6 or the capacitance detection circuit 700 shown in FIG. 7, and also can determine a touch position of a user on the triangle self-capacitance sensor 1000 by using the touch detection apparatus 800 shown in FIG. 8.

It should be understood that the triangle self-capacitance sensor 1000 is a capacitive touch screen sensor (Sensor) that only needs self-capacitance.

Optionally, an embodiment of the present disclosure provides a terminal device, where the terminal device includes the touch detection apparatus 800 shown in FIG. 8.

Therefore, the terminal device in the embodiment of the present disclosure can more accurately determine a position that a user touches on the touch detection device, so that an influence of self-capacitance on the touch sensitivity is overcome and touch sensitivity of the terminal device is improved, and further an existing self-capacitance detection device can be optimized.

Those of ordinary skill in the art may be aware that, units and circuits of the examples described in the embodiments disclosed in the text can be implemented by electronic hardware, or a combination of computer software and electronic hardware. Whether these functions are implemented in the form of hardware or software is determined by specific applications and design constraint conditions of the technical solutions. Those skilled may implement the described functions by using different methods for each specific application, but this implementation should not be considered as beyond the scope of the present disclosure.

Those of ordinary skill in the art may be aware that, units and circuits of the examples described in the embodiments disclosed in the text can be implemented by electronic hardware, or a combination of computer software and electronic hardware. Whether these functions are implemented in the form of hardware or software is determined by specific applications and design constraint conditions of the technical solutions. Those skilled may implement the described functions by using different methods for each specific application, but this implementation should not be considered as beyond the scope of the present disclosure.

If the integrated unit is implemented in the form of the software functional unit and is sold or used as an independent product, it may be stored in a computer readable storage medium. Based on such understanding, the technical solution of the present disclosure substantially, or the part of the present disclosure making contribution to the prior art, or a part of the technical solution may be embodied in the form of a software product, and the computer software product is stored in a storage medium, which includes multiple instructions enabling computer equipment (which may be a personal computer, a server, network equipment or the like) to execute all of or part of the steps in the methods of the embodiments of the present disclosure. The foregoing storage medium includes a variety of media capable of storing program codes, such as a USB disk, a mobile hard disk, a read-only memory (ROM), a random access memory (RAM), a magnetic disk, an optical disk or the like.

The foregoing description is only the specific implementation of the present disclosure, but the protection scope of the present disclosure is not limited thereto, those skilled who are familiar with the art could readily think of variations or substitutions within the technical scope disclosed by the present disclosure, and these variations or substitutions shall fall within the protection scope of the present disclosure. Therefore, the protection scope of the claims should prevail over the protection scope of the present disclosure.

What is claimed is:

1. A differential circuit, wherein the differential circuit comprises a front-end circuit and a processing circuit, and the front-end circuit is configured to convert capacitance signals of two capacitors connected to the front-end circuit into voltage signals and perform a difference operation on the voltage signals of the two capacitors connected to the front-end circuit, the front-end circuit comprises a control circuit and a programmable gain amplification (PGA) circuit, and the control circuit is connected with a power supply, the two capacitors, and the PGA circuit;

the control circuit is configured to control, at a first stage of a detection period, the power supply to charge the two capacitors connected to the front-end circuit and control the two capacitors connected to the front-end circuit to discharge to the PGA circuit, and control, at a second stage of the detection period, the PGA circuit to charge the two capacitors connected to the front-end circuit;

the PGA circuit is configured to convert the capacitance signals of the two capacitors connected to the front-end circuit into the voltage signals at the first stage and the second stage respectively, and perform a difference operation on the voltage signals of the two capacitors connected to the front-end circuit to obtain a differential signal of the voltage signals corresponding to the two capacitors connected to the front-end circuit at the first stage and a differential signal of the voltage signals corresponding to the two capacitors connected to the front-end circuit at the second stage;

the front-end circuit outputs the differential signal of the two capacitors connected to the front-end circuit at the first stage and outputs the differential signal of the two capacitors connected to the front-end circuit at the second stage; and the processing circuit is connected to the front-end circuit and is configured to determine, according to the differential signal output by the front-end circuit at the first stage and the differential signal output by the front-end circuit at the second stage, a target differential signal of voltages corresponding to the two capacitors connected to the front-end circuit.

2. The differential circuit according to claim 1, wherein the control circuit comprises a first switch set, a second switch set and a third switch set, the first switch set comprises a first switch and a second switch, one end of the first switch is connected to the power supply and the other end of the first switch is connected to the second switch set, one end of the second switch is grounded and the other end of the second switch is connected to the second switch set, the second switch set is connected to the two capacitors connected to the front-end circuit, and the third switch set is connected to the PGA circuit and the two capacitors connected to the front-end circuit.

3. The differential circuit according to claim 2, wherein the first stage comprises a first time period and a second time period, and the second stage comprises a third time period and a fourth time period, the first switch and the second switch set are turned on during the first time period, the second switch and the third switch set are turned off during the first time period, and the power supply charges the two capacitors connected to the front-end circuit in the first time period;

the second switch set is turned off during the second time period, the third switch set is turned on during the second time period, and the two capacitors connected to the front-end circuit discharges to the PGA circuit in the second time period;

the first switch and the third switch set are turned off during the third time period, and the second switch and the second switch set are turned on during the third time period, and the voltage signals of the two capacitors connected to the front-end circuit discharge to ground in the third time period; and the second switch set is turned off during the fourth time period, the third switch set is turned on during the fourth time period, and the PGA circuit charges the two capacitors connected to the front-end circuit in the fourth time period.

4. The differential circuit according to claim 3, wherein the second time period and the fourth time period are equal in length.

5. The differential circuit according to claim 1, wherein the first stage comprises a first time period and a second time period, and the second stage comprises a third time period and a fourth time period, the first switch and the second switch set are turned on during the first time period, the second switch and the third switch set are turned off during the first time period, and the power supply charges the two capacitors connected to the front-end circuit in the first time period;

the second switch set is turned off during the second time period, the third switch set is turned on during the second time period, and the two capacitors connected to the front-end circuit discharges to the PGA circuit in the second time period;

the first switch and the third switch set are turned off during the third time period, and the second switch and the second switch set are turned on during the third time period, and the voltage signals of the two capacitors connected to the front-end circuit discharge to ground in the third time period; and the second switch set is turned off during the fourth time period, the third switch set is turned on during the fourth time period, and the PGA circuit charges the two capacitors connected to the front-end circuit in the fourth time period.

6. The differential circuit according to claim 5, wherein the second time period and the fourth time period are equal in length.

7. The differential circuit according to claim 1, wherein the target differential signal of the two capacitors connected to the front-end circuit is a difference between the differential signal of the two capacitors connected to the front-end circuit at the second stage and the differential signal of the two capacitors connected to the front-end circuit at the first stage.

8. The differential circuit according to claim 1, wherein the front-end circuit further comprises a filter circuit and/or an integrator circuit, the filter circuit is configured to filter an interference signal from the target differential signal output by the front-end circuit, and the integrator circuit is configured to perform integral amplification processing on the target differential signal output by the front-end circuit.

9. A capacitance detection circuit for detecting capacitance of N to-be-detected capacitors, wherein N is greater than or equal to 2, and the capacitance detection circuit comprises at least N−1 first front-end circuits configured to convert capacitance signals of to-be-detected capacitors into first voltage signals and perform a difference operation on the first voltage signals, at least one second front-end circuit configured to convert the capacitance signals of the to-be-detected capacitors into second voltage signals and perform a difference operation on the second voltage signals, and a processing circuit, wherein:

each of the at least N−1 first front-end circuits comprises a first input end and a second input end, and each of the at least one second front-end circuit comprises a third input end and a fourth input end, a first input end and a second input end of each of at least N−2 first front-end circuits are connected to two different to-be-detected capacitors respectively, a first input end of a first front-end circuit other than the at least N−2 first front-end circuits is connected to both a third input end of a second front-end circuit and a to-be-detected capacitor, a second input end of the first front-end circuit other than the at least N−2 first front-end circuits is connected to both a first input end of a first front-end circuit of the at least N−2 first front-end circuits and a to-be-detected capacitor, and the to-be-detected capacitors connected to the two input ends of the first front-end circuit other than the at least N−2 first front-end circuits are different to-be-detected capacitors, wherein:

each of the first front-end circuits comprises a first control circuit and a first programmable gain amplification (PGA) circuit, and the first control circuit is connected to a power supply, two to-be-detected capacitors connected to the first front-end circuit and the first PGA circuit, the first control circuit is configured to: control, at a first stage of a detection period, the power supply to charge the two to-be-detected capacitors connected to the first front-end circuit and control the two to-be-detected capacitors connected to the first front-end circuit to discharge to the first PGA circuit; and control, at a second stage of the detection period, the first PGA circuit to charge the two to-be-detected capacitors connected to the first front-end circuit, the first PGA circuit is configured to convert the capacitance signals of the two to-be-detected capacitors connected to the first front-end circuit into the first voltage signals at the first stage and the second stage respectively, and perform a difference operation on the first voltage signals of the two to-be-detected capacitors connected to the first front-end circuit, to obtain a first differential signal of voltages corresponding to the two to-be-detected capacitors connected to the first front-end circuit at the first stage and a first differential signal of voltages corresponding to the two to-be-detected capacitors connected to the first front-end circuit at the second stage;

a third input end of each of the at least one second front-end circuit is connected to a to-be-detected capacitor, and a fourth input end is connected to a reference capacitor, wherein:

each second front-end circuit comprises a second control circuit and a second PGA circuit, and the second control circuit is connected to a power supply, the second PGA circuit, the to-be-detected capacitor and the reference capacitor that are connected to the second front-end circuit, the second control circuit is configured to: control, at the first stage, the power supply to charge the to-be-detected capacitor and the reference capacitor that are connected to the second front-end circuit and control the to-be-detected capacitor and the reference capacitor that are connected to the second front-end circuit to discharge to the second PGA circuit; and control, at the second stage, the second PGA circuit to charge the to-be-detected capacitor and the reference capacitor that are connected to the second front-end circuit, the second PGA circuit is configured to convert capacitance signals of the to-be-detected capacitor and the reference capacitor that are connected to the second front-end circuit into the second voltage signals at the first stage and the second stage respectively, and perform a difference operation on the second voltage signals of the to-be-detected capacitor and the reference capacitor that are connected to the second front-end circuit, to obtain a second differential signal of voltages corresponding to the to-be-detected capacitor and the reference capacitor that are connected to the second front-end circuit at the first stage and a second differential signal of voltages corresponding to the to-be-detected capacitor and the reference capacitor that are connected to the second front-end circuit at the second stage;

each of the at least N−1 first front-end circuits outputs the first differential signal of the two to-be-detected capacitors connected to the front-end circuit at the first stage and outputs the first differential signal of the two to-be-detected capacitors connected to the front-end circuit at the second stage, each of the at least one second front-end circuit outputs the second differential signal of the to-be-detected capacitor and the reference capacitor that are connected to the second front-end circuit at the first stage and outputs the second differential signal of the to-be-detected capacitor and the reference capacitor that are connected to the second front-end circuit at the second stage; and the processing circuit is connected to an output end of each first front-end circuit and an output end of each second front-end circuit and is configured to: determine, according to the first differential signal output by the first front-end circuit at the first stage and the first differential signal output by the first front-end circuit at the second stage, a target differential signal of voltages corresponding to the two to-be-detected capacitors connected to the first front-end circuit; determine, according to the second differential signal output by the second front-end circuit at the first stage and the second differential signal output by the second front-end circuit at the second stage, a target differential signal of voltages corresponding to the to-be-detected capacitor and the reference capacitor that are connected to the second front-end circuit; and determine, according to the target differential signal of the two to-be-detected capacitors connected to the first front-end circuit and the target differential signal of the to-be-detected capacitor and the reference capacitor that are connected to the second front-end circuit, a capacitance value of each of the N to-be-detected capacitors.

10. The capacitance detection circuit according to claim 9, wherein the first control circuit comprises a first switch set, a second switch set and a third switch set, the first switch set comprises a first switch and a second switch, one end of the first switch is connected to the power supply and the other end of the first switch is connected to the second switch set, one end of the second switch is grounded and the other end of the second switch is connected to the second switch set, the second switch set is connected to the two to-be-detected capacitors connected to the first front-end circuit, and the third switch set is connected to the first PGA circuit and the two to-be-detected capacitors connected to the first front-end circuit.

11. The capacitance detection circuit according to claim 10, wherein the first stage comprises a first time period and a second time period, and the second stage comprises a third time period and a fourth time period, the first switch and the second switch set are turned on during the first time period, the second switch and the third switch set are turned off during the first time period, and the power supply charges the two to-be-detected capacitors connected to the first front-end circuit in the first time period, the second switch set is turned off during the second time period, the third switch set is turned on during the second time period, and the two to-be-detected capacitors connected to the first front-end circuit discharges to the first PGA circuit in the second time period, the first switch and the third switch set are turned off during the third time period, the second switch and the second switch set are turned on during the third time period, and the first voltage signals of the two to-be-detected capacitors connected to the first front-end circuit discharge to ground in the third time period, and the second switch set is turned off during the fourth time period, the third switch set is turned on during the fourth time period, and the first PGA circuit charges the two to-be-detected capacitors connected to the first front-end circuit in the fourth time period.

12. The capacitance detection circuit according to claim 11, wherein the second time period and the fourth time period are equal in length.

13. The capacitance detection circuit according to claim 10, wherein the fourth switch set and the first switch set are a same switch set or a different switch set, when the fourth switch set and the first switch set are a same switch set, the third switch and the first switch are a same switch and the fourth switch and the second switch are a same switch.

14. The capacitance detection circuit according to claim 10, wherein first switch sets in the first control circuit of at least part of the at least N−1 first front-end circuits are a same switch set, and/or fourth switch sets in the second control circuit of at least part of the at least one second front-end circuit are a same switch set.

15. The capacitance detection circuit according to claim 9, wherein the second control circuit comprises a fourth switch set, a fifth switch set and a sixth switch set, the fourth switch set comprises a third switch and a fourth switch, one end of the third switch is connected to the power supply and the other end of the third switch is connected to the fifth switch set, one end of the fourth switch is grounded and the other end of the fourth switch is connected to the fifth switch set, the fifth switch set is connected to the to-be-detected capacitor and the reference capacitor that are connected to the second front-end circuit, and the sixth switch set is connected to the second PGA circuit and the to-be-detected capacitor and the reference capacitor that are connected to the second front-end circuit.

16. The capacitance detection circuit according to claim 15, wherein the first stage comprises a first time period and a second time period, and the second stage comprises a third time period and a fourth time period, the third switch and the fifth switch set are turned on during the first time period, and the fourth switch and the sixth switch set are turned off during the first time period, and the power supply charges the to-be-detected capacitor and the reference capacitor that are connected to the second front-end circuit in the first time period, the fifth switch set is turned off during the second time period, the sixth switch set is turned on during the second time period, and the to-be-detected capacitor and the reference capacitor that are connected to the second front-end circuit discharges to the second PGA circuit in the second time period, the third switch and the six switch set are turned off during the third time period, the fourth switch and the fifth switch set are turned on during the third time period, and the first voltage signals of the to-be-detected capacitor and the reference capacitor that are connected to the second front-end circuit discharge to ground in the fourth time period; and the fifth switch set is turned off during the fourth time period, the sixth switch set is turned on during the fourth time period, and the second PGA circuit charges the to-be-detected capacitor and the reference capacitor that are connected to the second front-end circuit in the fourth time period.

17. The capacitance detection circuit according to claim 9, wherein the target differential signal of the two to-be-detected capacitors connected to the first front-end circuit is a difference between the first differential signal of the two to-be-detected capacitors connected to the first front-end circuit at the second stage and the first differential signal of the two to-be-detected capacitors connected to the first front-end circuit at the first stage;

the target differential signal of the to-be-detected capacitor and the reference capacitor that are connected to the second front-end circuit is a difference between the second differential signal of the to-be-detected capacitor and the reference capacitor that are connected to the second front-end circuit at the second stage and the second differential signal of the to-be-detected capacitor and the reference capacitor that are connected to the second front-end circuit at the first stage.

18. The capacitance detection circuit according to claim 9, wherein the first front-end circuit further comprises a first filter circuit and/or first an integrator circuit, the first filter circuit is configured to filter an interference signal from the target differential signal output by the first front-end circuit, and the first integrator circuit is configured to perform integral amplification processing on the target differential signal output by the first front-end circuit.

19. The capacitance detection circuit according to claim 9, wherein the second front-end circuit further comprises a second filter circuit and/or a second integrator circuit, the second filter circuit is configured to filter an interference signal from the target differential signal output by the second front-end circuit, and the second integrator circuit is configured to perform integral amplification processing on the target differential signal output by the second front-end circuit.

20. A touch detection apparatus, comprising a capacitance detection circuit for detecting capacitance of N to-be-detected capacitors, wherein N is greater than or equal to 2, and the capacitance detection circuit comprises at least N−1 first front-end circuits configured to convert capacitance signals of to-be-detected capacitors into first voltage signals and perform a difference operation on the first voltage signals, at least one second front-end circuit configured to convert the capacitance signals of the to-be-detected capacitors into second voltage signals and perform a difference operation on the second voltage signals, and a processing circuit, wherein:

each of the at least N−1 first front-end circuits comprises a first input end and a second input end, and each of the at least one second front-end circuit comprises a third input end and a fourth input end, a first input end and a second input end of each of at least N−2 first front-end circuits are connected to two different to-be-detected capacitors respectively, a first input end of a first front-end circuit other than the at least N−2 first front-end circuits is connected to both a third input end of a second front-end circuit and a to-be-detected capacitor, a second input end of the first front-end circuit other than the at least N−2 first front-end circuits is connected to both a first input end of a first front-end circuit of the at least N−2 first front-end circuits and a to-be-detected capacitor, and the to-be-detected capacitors connected to the two input ends of the first front-end circuit other than the at least N−2 first front-end circuits are different to-be-detected capacitors, wherein:

each of the first front-end circuits comprises a first control circuit and a first programmable gain amplification (PGA) circuit, and the first control circuit is connected to a power supply, two to-be-detected capacitors connected to the first front-end circuit and the first PGA circuit, the first control circuit is configured to: control, at a first stage of a detection period, the power supply to charge the two to-be-detected capacitors connected to the first front-end circuit and control the two to-be-detected capacitors connected to the first front-end circuit to discharge to the first PGA circuit; and control, at a second stage of the detection period, the first PGA circuit to charge the two to-be-detected capacitors connected to the first front-end circuit, the first PGA circuit is configured to convert the capacitance signals of the two to-be-detected capacitors connected to the first front-end circuit into the first voltage signals at the first stage and the second stage respectively, and perform a difference operation on the first voltage signals of the two to-be-detected capacitors connected to the first front-end circuit, to obtain a first differential signal of voltages corresponding to the two to-be-detected capacitors connected to the first front-end circuit at the first stage and a first differential signal of voltages corresponding to the two to-be-detected capacitors connected to the first front-end circuit at the second stage;

a third input end of each of the at least one second front-end circuit is connected to a to-be-detected capacitor, and a fourth input end is connected to a reference capacitor, wherein:

each second front-end circuit comprises a second control circuit and a second PGA circuit, and the second control circuit is connected to a power supply, the second PGA circuit, the to-be-detected capacitor and the reference capacitor that are connected to the second front-end circuit, the second control circuit is configured to: control, at the first stage, the power supply to charge the to-be-detected capacitor and the reference capacitor that are connected to the second front-end circuit and control the to-be-detected capacitor and the reference capacitor that are connected to the second front-end circuit to discharge to the second PGA circuit; and control, at the second stage, the second PGA circuit to charge the to-be-detected capacitor and the reference capacitor that are connected to the second front-end circuit, the second PGA circuit is configured to convert capacitance signals of the to-be-detected capacitor and the reference capacitor that are connected to the second front-end circuit into the second voltage signals at the first stage and the second stage respectively, and perform a difference operation on the second voltage signals of the to-be-detected capacitor and the reference capacitor that are connected to the second front-end circuit, to obtain a second differential signal of voltages corresponding to the to-be-detected capacitor and the reference capacitor that are connected to the second front-end circuit at the first stage and a second differential signal of voltages corresponding to the to-be-detected capacitor and the reference capacitor that are connected to the second front-end circuit at the second stage;

each of the at least N−1 first front-end circuits outputs the first differential signal of the two to-be-detected capacitors connected to the front-end circuit at the first stage and outputs the first differential signal of the two to-be-detected capacitors connected to the front-end circuit at the second stage, each of the at least one second front-end circuit outputs the second differential signal of the to-be-detected capacitor and the reference capacitor that are connected to the second front-end circuit at the first stage and outputs the second differential signal of the to-be-detected capacitor and the reference capacitor that are connected to the second front-end circuit at the second stage; and the processing circuit is connected to an output end of each first front-end circuit and an output end of each second front-end circuit and is configured to: determine, according to the first differential signal output by the first front-end circuit at the first stage and the first differential signal output by the first front-end circuit at the second stage, a target differential signal of voltages corresponding to the two to-be-detected capacitors connected to the first front-end circuit; determine, according to the second differential signal output by the second front-end circuit at the first stage and the second differential signal output by the second front-end circuit at the second stage, a target differential signal of voltages corresponding to the to-be-detected capacitor and the reference capacitor that are connected to the second front-end circuit; and determine, according to the target differential signal of the two to-be-detected capacitors connected to the first front-end circuit and the target differential signal of the to-be-detected capacitor and the reference capacitor that are connected to the second front-end circuit, a capacitance value of each of the N to-be-detected capacitors, wherein the touch detection apparatus determines a touch position of a user according to a capacitance value of each of the N to-be-detected capacitors determined by the capacitance detection circuit.

* * * * *